(12) United States Patent
Choi et al.

(10) Patent No.: US 12,132,105 B2
(45) Date of Patent: Oct. 29, 2024

(54) SEMICONDUCTOR DEVICE AND METHOD FOR FABRICATING THE SAME

(71) Applicant: Samsung Electronics Co., Ltd., Suwon-si (KR)

(72) Inventors: Hojun Choi, Anyang-si (KR); Ji Seong Kim, Eumseong-gun (KR); Min Cheol Oh, Seoul (KR); Ki-Il Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 328 days.

(21) Appl. No.: 17/571,949

(22) Filed: Jan. 10, 2022

(65) Prior Publication Data

US 2022/0320335 A1   Oct. 6, 2022

Related U.S. Application Data

(60) Provisional application No. 63/170,049, filed on Apr. 2, 2021.

(30) Foreign Application Priority Data

Jul. 22, 2021   (KR) .................. 10-2021-0096226

(51) Int. Cl.
*H01L 27/092* (2006.01)
*H01L 21/8238* (2006.01)
(Continued)

(52) U.S. Cl.
CPC .. *H01L 29/7827* (2013.01); *H01L 21/823814* (2013.01); *H01L 21/823885* (2013.01); *H01L 27/092* (2013.01); *H01L 29/0847* (2013.01); *H01L 29/42368* (2013.01); *H01L 29/66666* (2013.01)

(58) Field of Classification Search
CPC ............ H01L 29/7827; H01L 29/0847; H01L 29/42368; H01L 29/0657; H01L 29/66666; H01L 27/092; H01L 27/088; H01L 21/823814; H01L 21/823885; H01L 21/823412; H01L 21/823487;
(Continued)

(56) References Cited

U.S. PATENT DOCUMENTS 7,902,607 B2   3/2011   Kim et al.
8,241,823 B2   8/2012   Shieh et al.
(Continued)

*Primary Examiner* — Michael M Trinh
(74) *Attorney, Agent, or Firm* — HARNESS, DICKEY & PIERCE, P.L.C.

(57) ABSTRACT

There is provided a semiconductor device capable of improving electrical characteristics and integration density. The semiconductor device includes an active pattern protruding from a substrate, the active pattern including long sidewalls extending in a first direction and opposite to each other in a second direction, a lower epitaxial pattern on the substrate and covering a part of the active pattern, a gate electrode on the lower epitaxial pattern and extending along the long sidewalls of the active pattern, and an upper epitaxial pattern on the active pattern and connected to an upper surface of the active pattern. The active pattern includes short sidewalls connecting with the long sidewalls of the active pattern, and at least one of the short sidewalls of the active pattern has a curved surface.

20 Claims, 30 Drawing Sheets

(51) Int. Cl.
    *H01L 29/08*     (2006.01)
    *H01L 29/423*     (2006.01)
    *H01L 29/66*     (2006.01)
    *H01L 29/78*     (2006.01)

(58) Field of Classification Search
    CPC ......... H01L 21/823807; H01L 21/3086; H01L 21/823418
    See application file for complete search history.

(56) References Cited

U.S. PATENT DOCUMENTS

| | | | |
|---|---|---|---|
| 8,603,893 B1 | 12/2013 | Wei et al. | |
| 8,741,776 B2 | 6/2014 | De et al. | |
| 9,735,060 B1 | 8/2017 | Sung et al. | |
| 9,748,107 B2 | 8/2017 | Lo et al. | |
| 9,768,072 B1 | 9/2017 | Cheng | |
| 10,847,514 B2 | 11/2020 | Yoo et al. | |
| 11,080,453 B2* | 8/2021 | Huang | G06F 30/392 |
| 2005/0164516 A1* | 7/2005 | Chaudhry | H01L 29/518 |
| | | | 438/770 |
| 2013/0270653 A1* | 10/2013 | Lee | H01L 27/0207 |
| | | | 257/401 |
| 2019/0267325 A1* | 8/2019 | Lee | H01L 21/823456 |

\* cited by examiner

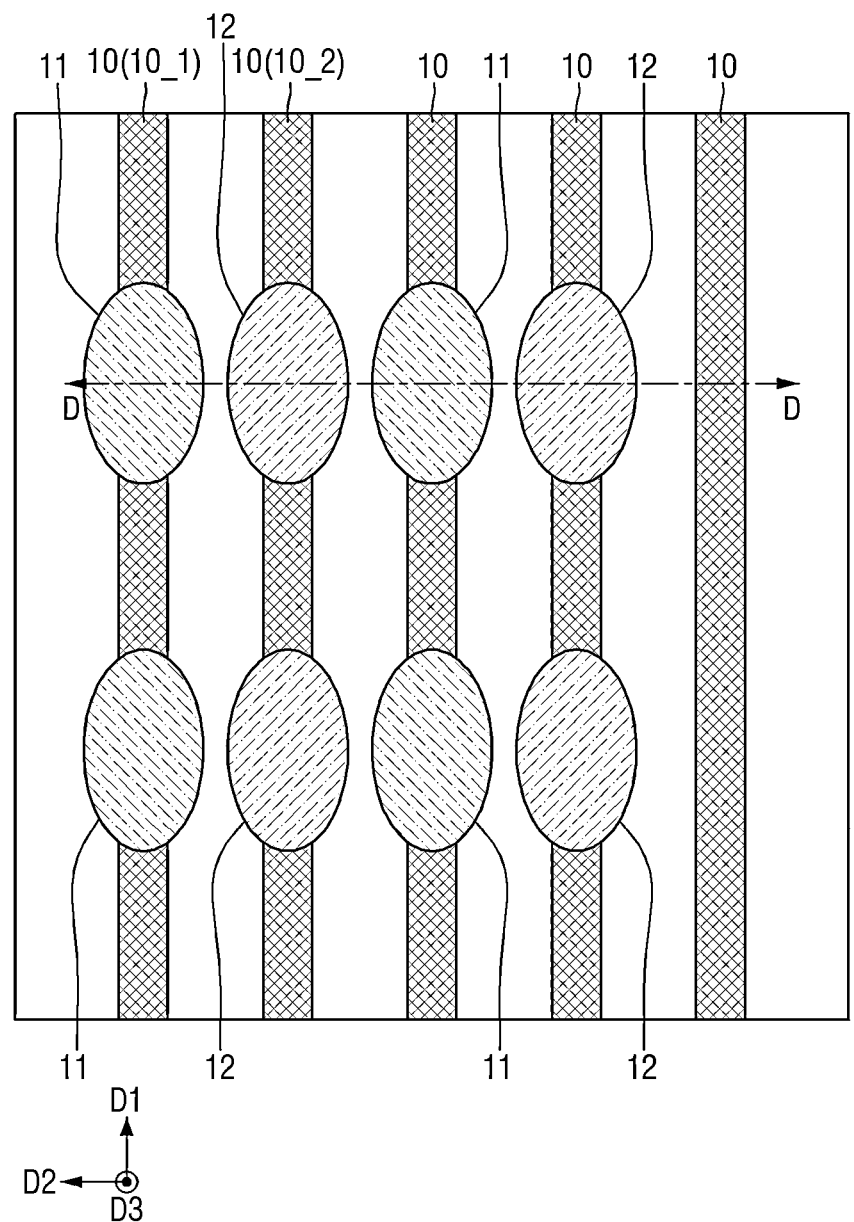

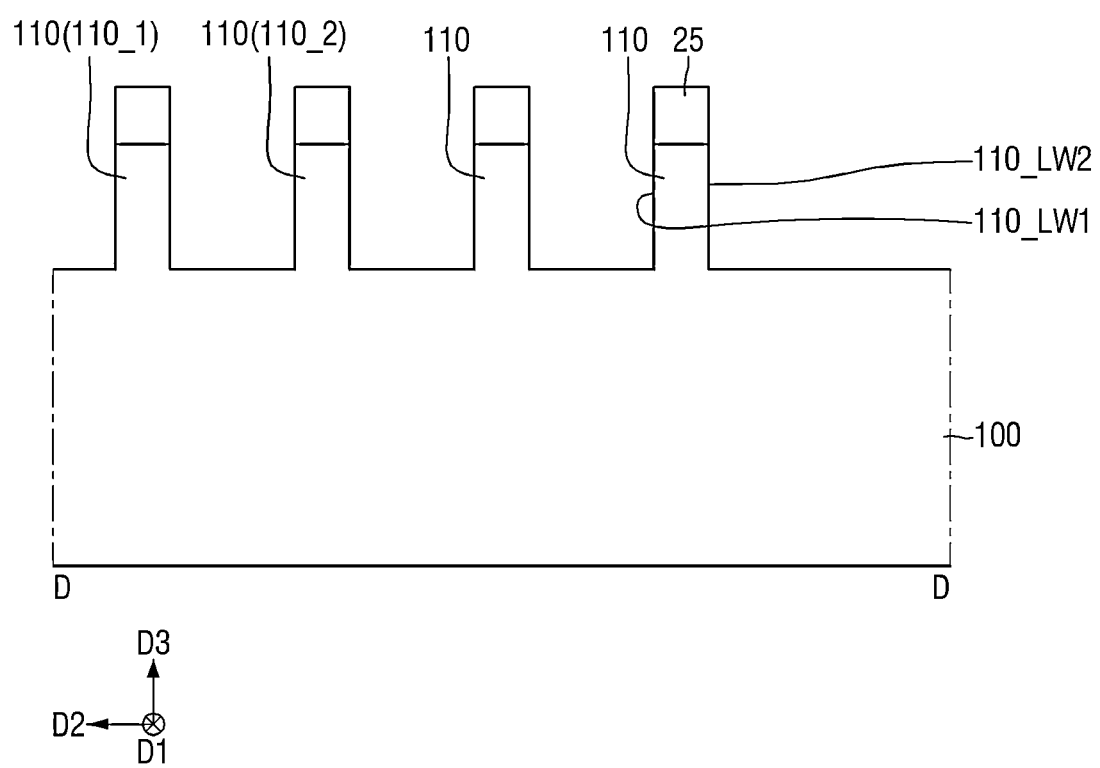

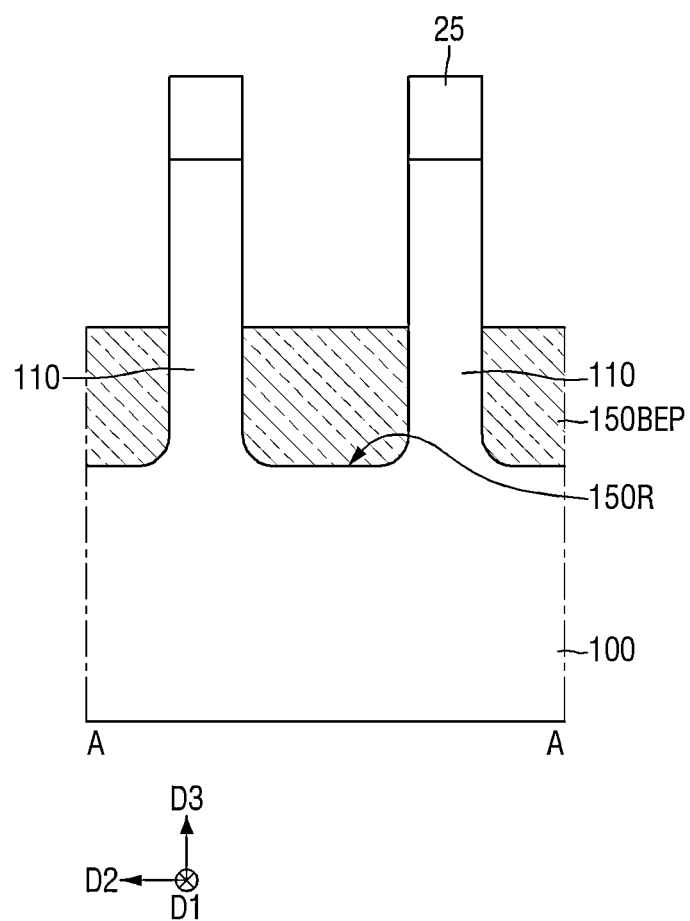

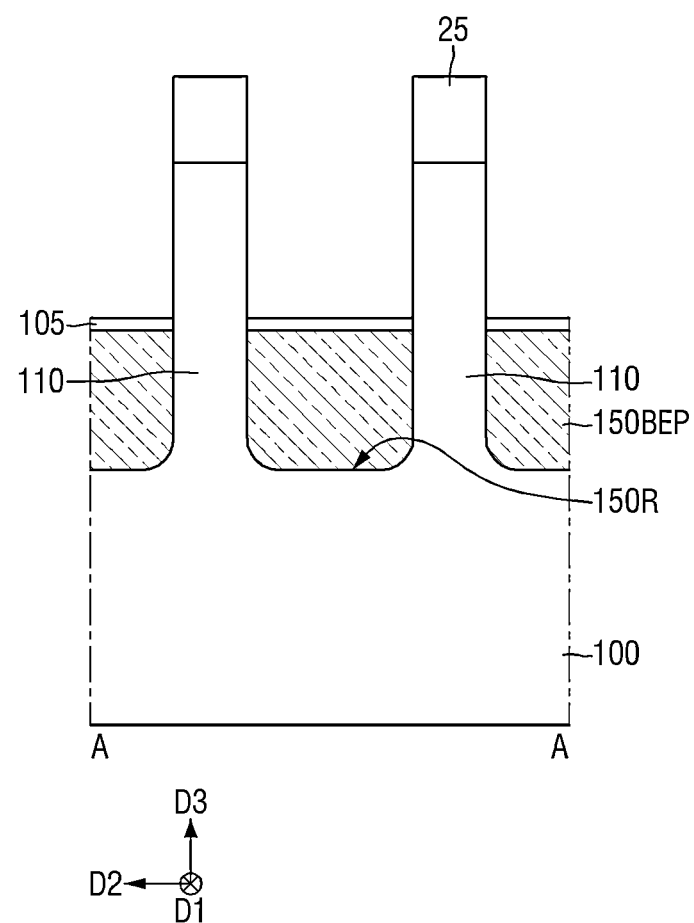

SEMICONDUCTOR DEVICE AND METHOD FOR FABRICATING THE SAME

CROSS-REFERENCE TO RELATED APPLICATION

This application claims priority from U.S. Provisional Application No. 63/170,049 filed on Apr. 2, 2021 in USPTO and Korean Patent Application No. 10-2021-0096226 filed on Jul. 22, 2021 in the Korean Intellectual Property Office, and all the benefits accruing therefrom under 35 U.S.C. § 119, the contents of each of which in their entirety are herein incorporated by reference.

BACKGROUND

Some example embodiments relate to a semiconductor device and a method for fabricating the same, and more particularly, to a semiconductor device including a vertical field effect transistor (VFET) and/or a method for fabricating the same.

Due to characteristics such as miniaturization, multifunctionality, and/or low manufacturing cost, a semiconductor device is in the spotlight as an important element in the electronic industry. The semiconductor devices may be divided into a semiconductor memory device for storing logic data, a semiconductor logic device for processing computation of logic data, a hybrid semiconductor device including a storage element and a logic element, and/or the like. As the electronic industry is highly developed, demands for characteristics of semiconductor devices are increasing.

For example, demands for high reliability, high speed, and/or multifunctionality for semiconductor devices are increasing. In order to satisfy these required characteristics, structures in semiconductor devices are becoming increasingly complex, and further, semiconductor devices are becoming more and more highly integrated.

SUMMARY

Some example embodiments provide a semiconductor device with improved electrical characteristics and integration density.

Alternative or additionally, some example embodiments also provide a method for fabricating a semiconductor device having improved electrical characteristics and integration density.

However, aspects of some example embodiments are not restricted to those set forth herein. The above and other aspects of some example embodiments will become more apparent to one of ordinary skill in the art to which some example embodiments pertains by referencing the detailed description of some example embodiments given below.

According to some example embodiments, there is provided a semiconductor device comprising an active pattern protruding from a substrate, the active pattern including long sidewalls extending in a first direction and opposite to each other in a second direction, a lower epitaxial pattern on the substrate and covering a part of the active pattern, a gate electrode on the lower epitaxial pattern and extending along the long sidewalls of the active pattern, and an upper epitaxial pattern on the active pattern and connected to an upper surface of the active pattern. The active pattern includes short sidewalls connecting with the long sidewalls of the active pattern, and at least one of the short sidewalls of the active pattern has a curved surface.

According to some example embodiments, there is provided a semiconductor device comprising a first active pattern protruding from a substrate and having a first length in a first direction, a second active pattern protruding from the substrate, spaced apart from the first active pattern in a second direction, and having a second length in the first direction that is different from the first length, a lower epitaxial pattern between the first active pattern and the second active pattern on the substrate and covering a part of the first active pattern and a part of the second active pattern, a first gate electrode on the lower epitaxial pattern and extending along first long sidewalls of the first active pattern, a second gate electrode on the lower epitaxial pattern and extending along second long sidewalls of the second active pattern, a first upper epitaxial pattern on the first active pattern and connected to an upper surface of the first active pattern, and a second upper epitaxial pattern on the second active pattern and connected to an upper surface of the second active pattern. The first long sidewalls of the first active pattern and the second long sidewalls of the second active pattern extend in the first direction, the first active pattern includes first short sidewalls connecting with the first long sidewalls of the first active pattern, the second active pattern includes second short sidewalls connecting with the second long sidewalls of the second active pattern, and each of the first short sidewalls of the first active pattern and the second short sidewalls of the second active pattern has a curved surface.

According to some example embodiments, there is provided a semiconductor device comprising a first active pattern protruding from a substrate, the first active pattern including long sidewalls extending in a first direction and opposite to each other in a second direction, a second active pattern protruding from the substrate, spaced apart from the first active pattern in a first direction, and including long sidewalls opposite to each other in the second direction, a first lower epitaxial pattern covering a part of the first active pattern, a second lower epitaxial pattern covering a part of the second active pattern, a first gate electrode on the first lower epitaxial pattern and extending along first long sidewalls of the first active pattern, a second gate electrode on the second lower epitaxial pattern and extending along second long sidewalls of the second active pattern, a first upper epitaxial pattern on the first active pattern and connected to an upper surface of the first active pattern, and a second upper epitaxial pattern on the second active pattern and connected to an upper surface of the second active pattern. Each of a first short sidewall of the first active pattern and a second short sidewall of the second active pattern facing each other in the first direction has a curved surface.

BRIEF DESCRIPTION OF THE DRAWINGS

The above and other aspects and features of some example embodiments will become more apparent by describing in detail example embodiments thereof with reference to the attached drawings, in which.

DETAILED DESCRIPTION OF EXAMPLE EMBODIMENTS

Figure 1:
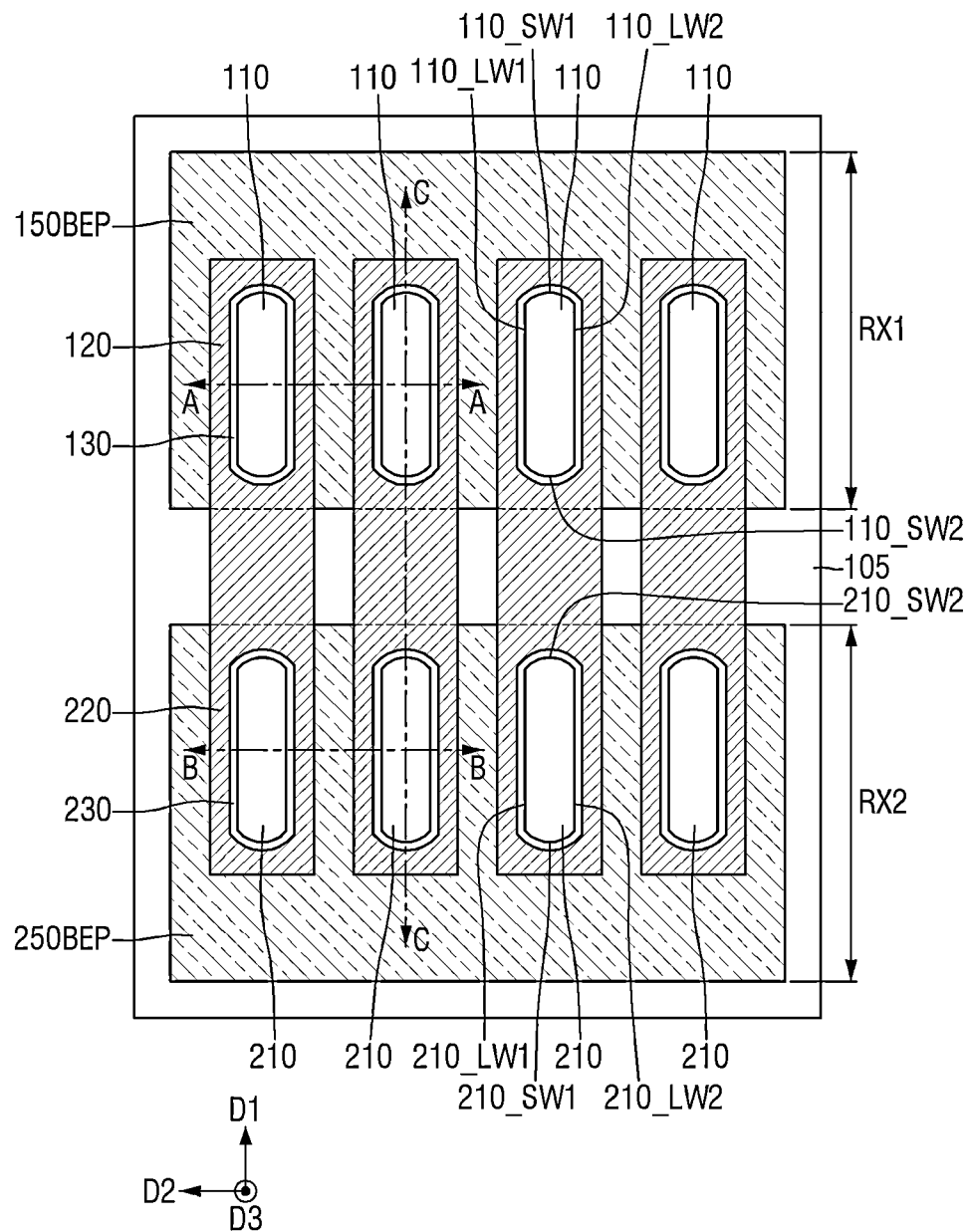
FIG. 1 is an example plan view illustrating a semiconductor device according to some example embodiments.
Figure 2:
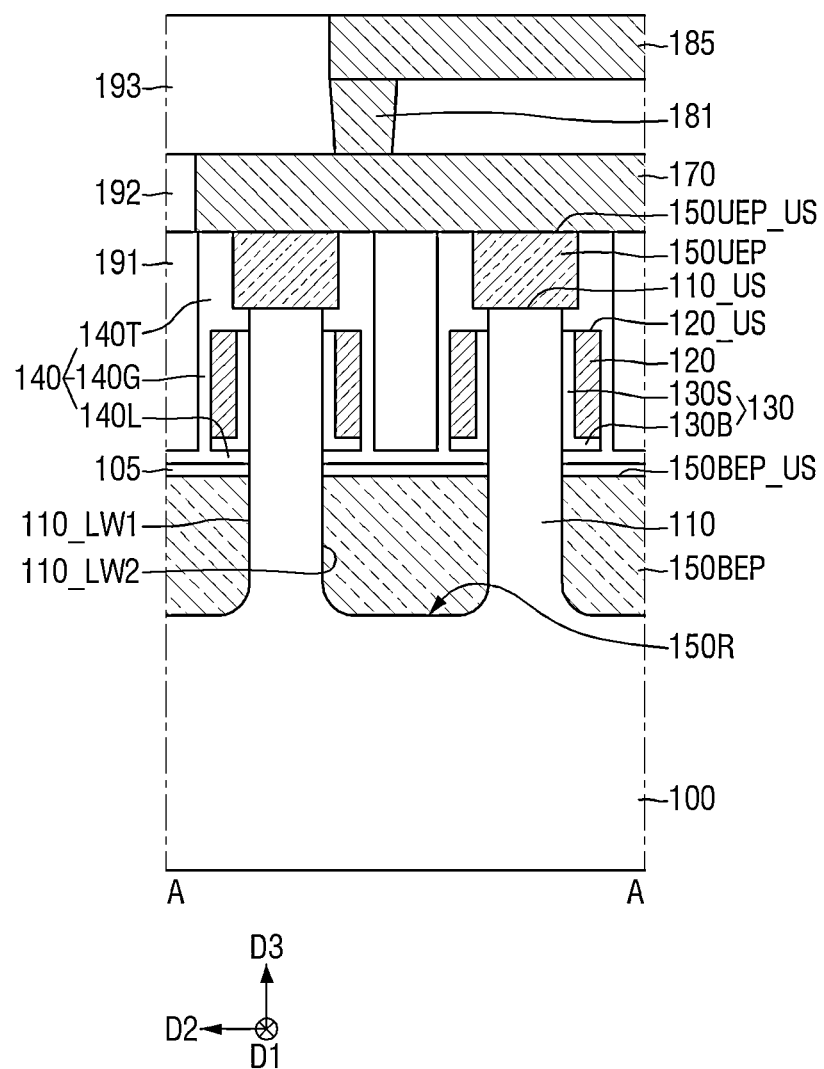
FIGS. 2 to 4 are example cross-sectional views taken along lines A-A, B-B, and C-C of FIG. 1, respectively.
Figure 3:
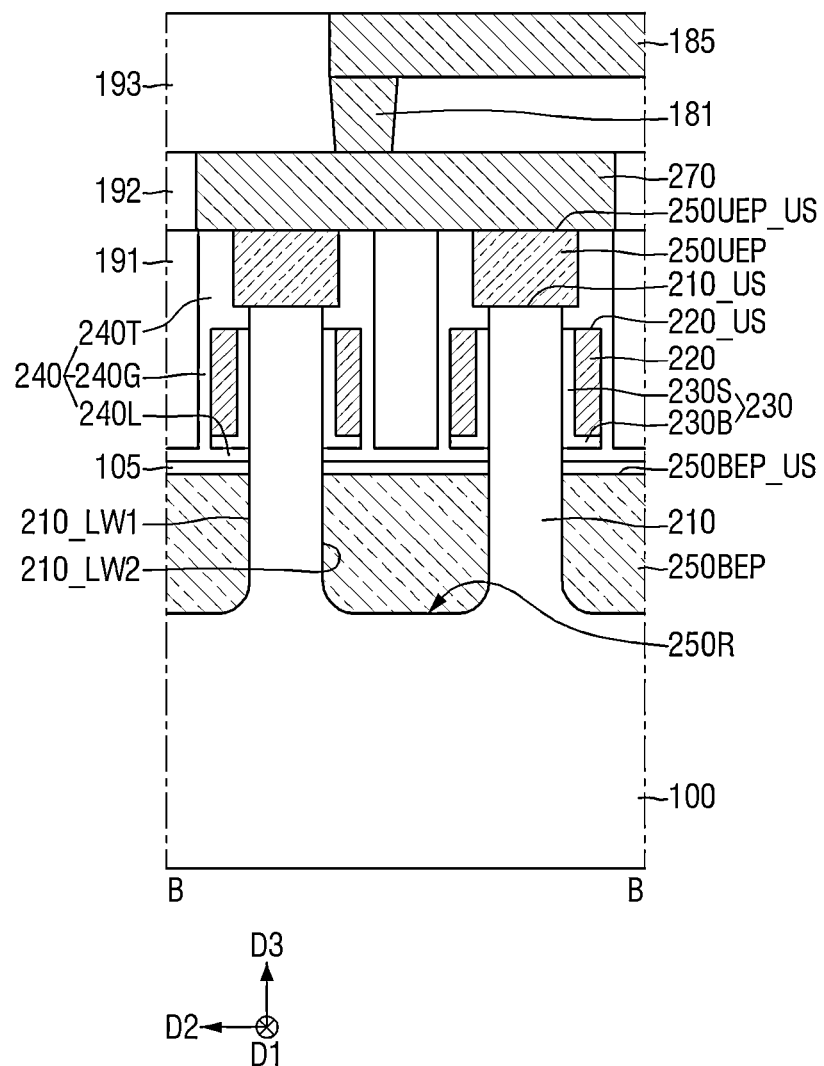
Figure 4:
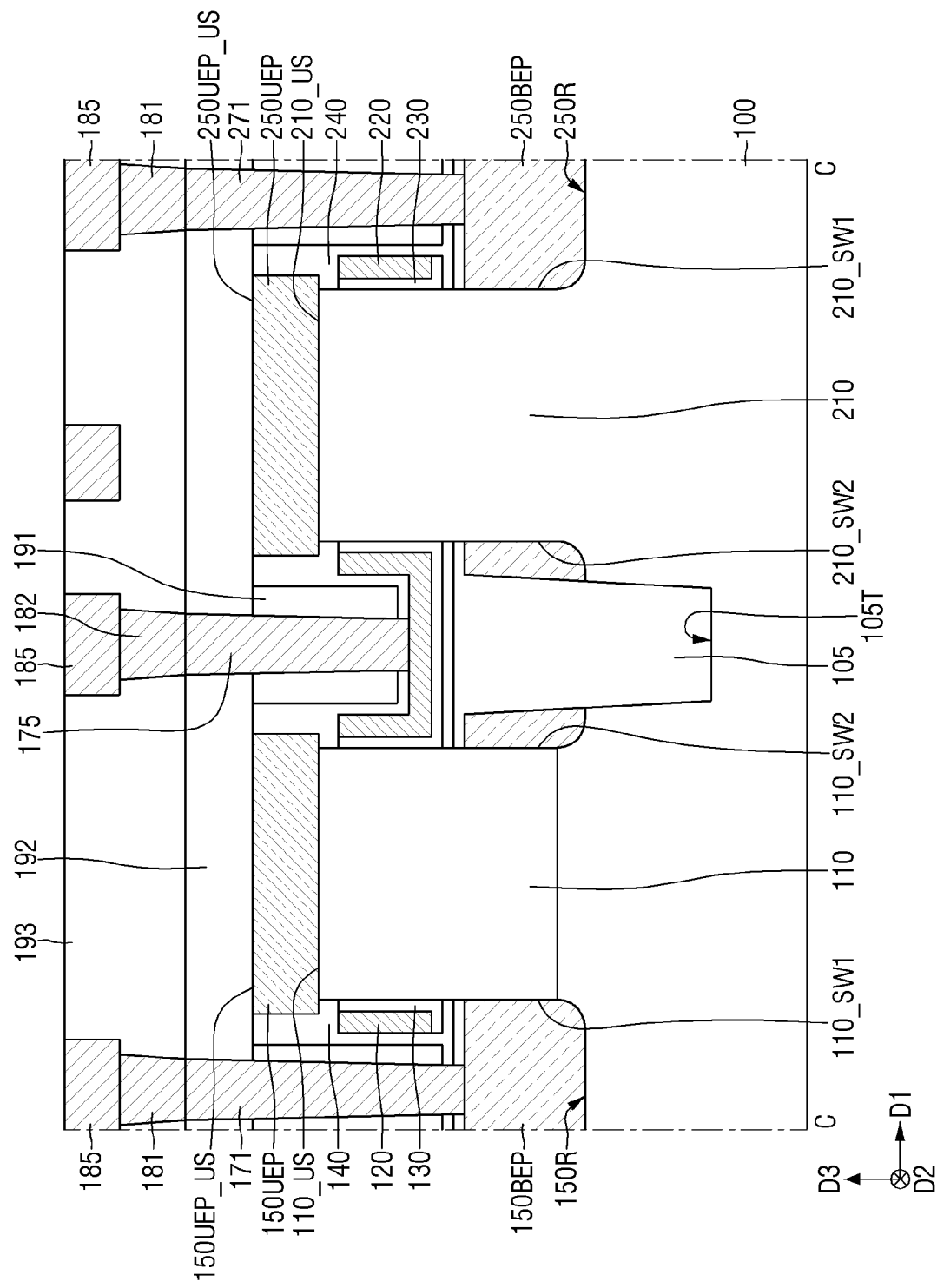

FIG. 1 is an example plan view illustrating a semiconductor device according to some example embodiments. FIGS. 2 to 4 are example cross-sectional views taken along lines A-A, B-B, and C-C of FIG. 1, respectively.

For reference and convenience, FIG. 1 does not illustrate upper epitaxial patterns 150UEP and 250UEP, spacers 140 and 240, contacts 170, 171, 175, 270, and 271, vias 181 and 182, a wiring line 185, and the like.

A semiconductor device described below may include a logic cell. The logic cell may mean or correspond to a standard cell, such as a logic element (e.g., an inverter, a flip-flop, a logic gate such as an AOI gate, and/or the like) performing a specific function. The logic cell may include vertical transistors (vertical FET) constituting or being part of a logic element and wires connecting the vertical transistors to each other.

Referring to FIGS. 1 to 4, a semiconductor device according to some example embodiments may include a first active pattern 110, a second active pattern 210, a first lower epitaxial pattern 150BEP, and a second lower epitaxial pattern 250BEP, a first gate electrode 120, a second gate electrode 220, a first gate insulating layer 130, a second gate insulating layer 230, the first spacer 140, the second spacer 240, the first upper epitaxial pattern 150UEP, the second upper epitaxial pattern 250UEP, the first lower epitaxial contact 171, the second lower epitaxial contact 271, the first upper epitaxial contact 170, the second upper epitaxial contact 270, a gate contact 175, the source/drain via 181, the gate via 182, and the wiring line 185.

The substrate 100 may be or include a bulk silicon or silicon-on-insulator (SOI) substrate. Alternatively, the substrate 100 may be a silicon substrate, or may include other materials such as silicon germanium, silicon germanium on insulator (SGOI), indium antimonide, a lead tellurium compound, indium arsenide, indium phosphide, gallium arsenide, or gallium antimonide, but is not limited thereto. The substrate 100 may be lightly doped; however, example embodiments are not limited thereto. The substrate 100 may include single-crystal semiconductor material and/or polycrystalline semiconductor material; however, example embodiments are not limited thereto.

The substrate 100 may include a first active region RX1 and a second active region RX2. In some example embodiments, the first active region RX1 may be a PMOSFET region (e.g. a region including PMOS transistors), and the second active region RX2 may be an NMOSFET region (e.g. a region including NMOS transistors). In some example embodiments, the first active region RX1 and the second active region RX2 may be PMOSFET regions. In some example embodiments, the first active region RX1 and the second active region RX2 may be NMOSFET regions. In some example embodiments, either or both of the first active region RX1 and the second active region RX2 may include both PMOS transistors and NMOS transistors; however, example embodiments are not limited thereto.

The first active pattern 110 may be disposed on the substrate 100. The first active pattern 110 may be disposed in the first active region RX1 of the substrate 100. The first active pattern 110 may protrude from the substrate 100 in the third direction D3.

The first active pattern 110 may be elongated in the first direction D1. When the plurality of first active patterns 110 are disposed in the first active region RX1, the first active patterns 110 may be adjacent to each other in the second direction D2. The adjacent first active patterns 110 are spaced apart from each other in the second direction D2.

The first active pattern 110 includes a first long sidewall 110_LW1 and a second long sidewall 110_LW2 that are elongated in the first direction D1. The first long sidewall 110_LW1 of the first active pattern and the second long sidewall 110_LW2 of the first active pattern are opposite to each other in the second direction D2. For example, in a plan view, the first long sidewall 110_LW1 of the first active pattern and the second long sidewall 110_LW2 of the first active pattern may be straight lines, and may be parallel to the first direction D1.

The first active pattern 110 includes a first short sidewall 110_SW1 and a second short sidewall 110_SW2 connecting with/contiguous with the first long sidewall 110_LW1 of the first active pattern with the second long sidewall 110_LW2 of the first active pattern. The first short sidewall 110_SW1 of the first active pattern is a surface opposite to the second short sidewall 110_SW2 of the first active pattern in the first direction D1. Each of the first short sidewall 110_SW1 of the first active pattern and the second short sidewall 110_SW2 of the first active pattern may have a curved surface, e.g. a curved profile in a plan view. For example, each of the first short sidewall 110_SW1 of the first active pattern and the second short sidewall 110_SW2 of the first active pattern may be a convex curved surface protruding in the first direction D1. In plan view, the first short sidewall 110_SW1 of the first active pattern and the second short sidewall 110_SW2 of the first active pattern may be curved lines.

For example, in plan view, as moving from the first long sidewall 110_LW1 of the first active pattern to the second long sidewall 110_LW2 of the first active pattern, the width of the first active pattern 110 in the first direction D1 may increase, e.g. up to a local maximum, and then may decrease. Here, the width of the first active pattern 110 in the first direction D1 is based on the upper surface 110_US of the first active pattern.

The second active pattern 210 may be disposed on the substrate 100. The second active pattern 210 may be disposed in the second active region RX2 of the substrate 100. The second active pattern 210 may protrude from the substrate 100 in the third direction D3.

The second active pattern 210 may be elongated in the first direction D1. When the plurality of second active patterns 210 are disposed in the second active region RX2, the second active patterns 210 may be adjacent to each other in the second direction D2. The adjacent second active patterns 210 are spaced apart from each other in the second direction D2. The second active pattern 210 is spaced apart from the first active pattern 110 in the first direction D1. The corresponding first active pattern 110 and second active pattern 210 may be aligned in the first direction D1.

Here, the first direction D1 may intersect the second direction D2 and a third direction D3. Further, the second direction D2 may intersect the third direction D3. The third direction D3 may be a direction perpendicular to the upper surface of the substrate 100. The third direction D3 may be a direction perpendicular to the upper surface of the substrate 100. The first direction D1, the second direction D2, and the third direction D3 may be perpendicular with one another; however, example embodiments are not limited thereto. Alternatively or additionally, at least one of the first direction D1 or the second direction D2 may be a direction parallel with a crystal orientation of the substrate 100; however, example embodiments are not limited thereto.

The second active pattern 210 includes the first long sidewall 210_LW1 and the second long sidewall 210_LW2 elongated in the first direction D1. The first long sidewall 210_LW1 of the second active pattern and the second long sidewall 210_LW2 of the second active pattern are opposite to each other in the second direction D2. In plan view, the first long sidewall 210_LW1 of the second active pattern and the second long sidewall 210_LW2 of the second active pattern may be straight lines, and may be parallel with the first direction D1.

The second active pattern 210 includes a first short sidewall 210_SW1 and a second short sidewall 210_SW2 connecting the first long sidewall 210_LW1 of the second active pattern with the second long sidewall 210_LW2 of the second active pattern. The first short sidewall 210_SW1 of the second active pattern is a surface opposite to the second short sidewall 210_SW2 of the second active pattern in the first direction D1. In the corresponding first active pattern 110 and second active pattern 210, the second short sidewall 210_SW2 of the second active pattern may face the second short sidewall 110_SW2 of the first active pattern. Each of the first short sidewall 210_SW1 of the second active pattern and the second short sidewall 210_SW2 of the second active pattern may have a curved surface. For example, each of the first short sidewall 210_SW1 of the second active pattern and the second short sidewall 210_SW2 of the second active pattern may be a convex curved surface protruding in the first direction D1. In plan view, the first short sidewall 210_SW1 of the second active pattern and the second short sidewall 210_SW2 of the second active pattern may be curved lines (e.g. may not be straight).

For example, in plan view, as moving from the first long sidewall 210_LW1 of the second active pattern to the second long sidewall 210_LW2 of the second active pattern, the width of the second active pattern 210 in the first direction D1 may increase e.g. up to a local maximum and then may decrease. Here, the width of the second active pattern 210 in the first direction D1 is based on the upper surface 210_US of the second active pattern. The maximum width of second active pattern 210 in the first direction D1 may be the same as, less than, or greater than the maximum width of the first active pattern 110 in the first direction D1.

Although the four first active patterns 110 are disposed in the first active region RX1 and the four second active patterns 210 are disposed in the second active region RX2, example embodiments are not limited thereto.

Each of the first active pattern 110 and the second active pattern 210 may be a part of the substrate 100 and may include an epitaxial layer, e.g. a layer grown or at least partially grown from or on the substrate 100. Each of the first active pattern 110 and the second active pattern 210 may include, for example, silicon and/or germanium, which is an elemental semiconductor material. Alternatively or additionally, the first active pattern 110 and the second active pattern 210 may include a compound semiconductor, for example, a group IV-IV compound semiconductor and/or a group III-V compound semiconductor.

The group IV-IV compound semiconductor may be a binary compound or a ternary compound including at least two elements selected from the group consisting of carbon (C), silicon (Si), germanium (Ge) and tin (Sn), or the above-mentioned compound doped with a group IV element. The group III-V compound semiconductor may be, for example, a binary compound, a ternary compound or a quaternary compound formed by combining at least one of aluminum (Al), gallium (Ga) and indium (In) which are group III elements with one of phosphorus (P), arsenic (As) and antimony (Sb) which are group V elements. In one example, the first active pattern 110 and the second active pattern 210 may contain the same material. In some example embodiments, the first active pattern 110 and the second active pattern 210 may contain different materials.

The first lower epitaxial pattern 150BEP may be disposed on the substrate 100. The first lower epitaxial pattern 150BEP may cover a part of the first active pattern 110. For example, the first lower epitaxial pattern 150BEP may cover a part of each of the first long sidewall 110_LW1 of the first active pattern, the second long sidewall 110_LW2 of the first active pattern, a first short sidewall 110_SW1 of the first active pattern, and the second short sidewall 110_SW2 of the first active pattern. The first active pattern 110 further protrudes in the third direction D3 than the upper surface 150BEP_US of the first lower epitaxial pattern.

The first lower epitaxial pattern 150BEP may fill a first lower epitaxial recess 150R. The first lower epitaxial recess 150R may define a part of the first long sidewall 110_LW1 of the first active pattern, the second long sidewall 110_LW2 of the first active pattern, the first short sidewall 110_SW1 of the first active pattern, and the second short sidewall 110_SW2 of the first active pattern. The first lower epitaxial pattern 150BEP may be a heterogeneous epitaxial layer, or a homogeneous epitaxial layer; however, example embodiments are not limited thereto.

In plan view, the first lower epitaxial pattern 150BEP may overlap the first active region RX1. For example, the region in which the first lower epitaxial pattern 150BEP is formed may be the first active region RX1. In plan view, the first lower epitaxial pattern 150BEP may surround the perimeter of the first active pattern 110.

The second lower epitaxial pattern 250BEP may be disposed on the substrate 100. The second lower epitaxial pattern 250BEP may cover a part of the second active pattern 210. For example, the second lower epitaxial pattern 250BEP may cover a part of each of the first long sidewall 210_LW1 of the second active pattern, the second long sidewall 210_LW2 of the second active pattern, the first short sidewall 210_SW1 of the second active pattern, and the second short sidewall 210_SW2 of the second active pattern. The second active pattern 210 further protrudes in the third direction D3 than the upper surface 250BEP_US of the second lower epitaxial pattern.

The second lower epitaxial pattern 250BEP may fill a second lower epitaxial recess 250R. The second lower epitaxial recess 250R may define a part of the first long sidewall 210_LW1 of the second active pattern, the second long sidewall 210_LW2 of the second active pattern, the first short sidewall 210_SW1 of the second active pattern, and the second short sidewall 210_SW2 of the second active pattern. The second lower epitaxial pattern 250BEP may be a heterogeneous epitaxial pattern, or a homogenous epitaxial pattern; however, example embodiments are not limited thereto. The second lower epitaxial pattern 250BEP may include the same, or different, material than that of the first lower epitaxial pattern 150BEP.

In plan view, the second lower epitaxial pattern 250BEP may overlap the second active region RX2. For example, the region in which the second lower epitaxial pattern 250BEP is formed may be the second active region RX2. In plan view, the second lower epitaxial pattern 250BEP may surround the perimeter of the second active pattern 210.

For example, each of the first lower epitaxial pattern 150BEP and the second lower epitaxial pattern 250BEP may be an epitaxial semiconductor pattern formed by a selective epitaxial growth process. Each of the first lower epitaxial pattern 150BEP and the second lower epitaxial pattern 250BEP may be included in the source/drain of the vertical transistor.

A field separation pattern 105 may be disposed on the substrate 100. The field separation pattern 105 may fill a field trench 105T. A portion of the field trench 105T may be formed in the substrate 100.

The field trench 105T may separate the first lower epitaxial pattern 150BEP from the second lower epitaxial pattern 250BEP. The field separation pattern 105 may separate the first lower epitaxial pattern 150BEP from the second lower epitaxial pattern 250BEP. The first active region RX1 and the second active region RX2 may be defined by the field separation pattern 105. For example, the field separation pattern 105 may cover the upper surface 150BEP_US of the first lower epitaxial pattern and the upper surface 250BEP_US of the second lower epitaxial pattern. Each of the first active pattern 110 and the second active pattern 210 may vertically protrude above the field separation pattern 105.

The field separation pattern 105 may include, for example, an oxide layer, a nitride layer, an oxynitride layer, or a combination layer thereof.

The first gate electrode 120 may be disposed on the field separation pattern 105. The first gate electrode 120 may be disposed on the first lower epitaxial pattern 150BEP. The first gate electrode 120 may extend in the first direction D1.

The first gate electrode 120 may extend in the first direction D1 along the long sidewalls 110_LW1 and 110_LW2 of the first active pattern. The first gate electrode 120 may be disposed on the short sidewalls 110_SW1 and 110_SW2 of the first active pattern. In plan view, the first gate electrode 120 may surround the perimeter of the first active pattern 110.

The first gate electrode 120 may cover a part of each of the first long sidewall 110_LW1 of the first active pattern, the second long sidewall 110_LW2 of the first active pattern, a first short sidewall 110_SW1 of the first active pattern, and the second short sidewall 110_SW2 of the first active pattern. For example, the upper surface 120_US of the first gate electrode is lower than (e.g. closer to the upper surface of the substrate 100 than) the upper surface 110_US of the first active pattern. Based on the upper surface 150BEP_US of the first lower epitaxial pattern, the height of the upper surface 120_US of the first gate electrode is smaller than the height of the upper surface 110_US of the first active pattern.

In some example embodiments, when the plurality of first active patterns 110 are disposed in the first active region RX1, the one first gate electrode 120 may surround the perimeter of the corresponding one first active pattern 110. The adjacent first gate electrodes 120 may be spaced apart from each other in the second direction D2. In some example embodiments, unlike the illustrated example, when the plurality of first active patterns 110 are disposed in the first active region RX1, the one first gate electrode 120 may also surround the perimeter of the plurality of first active patterns 110.

The second gate electrode 220 may be disposed on the field separation pattern 105. The second gate electrode 220 may be disposed on the second lower epitaxial pattern 250BEP. The second gate electrode 220 may extend in the first direction D1.

The second gate electrode 220 may extend in the first direction D1 along the long sidewalls 210_LW1 and 210_LW2 of the second active pattern. The second gate electrode 220 may be disposed on the short sidewalls 210_SW1 and 210_SW2 of the second active pattern. In plan view, the second gate electrode 220 may surround the perimeter of the second active pattern 210.

The second gate electrode 220 may cover a part of each of the first long sidewall 210_LW1 of the second active pattern, the second long sidewall 210_LW2 of the second active pattern, the first short sidewall 210_SW1 of the second active pattern, and the second short sidewall 210_SW2 of the second active pattern. For example, the upper surface 120_US of the first gate electrode is lower than the upper surface 110_US of the first active pattern. Based on the upper surface 250BEP_US of the second lower epitaxial pattern, the height of the upper surface 220_US of the second gate electrode is smaller than the height of the upper surface 210_US of the second active pattern.

In some example embodiments, when the plurality of second active patterns 210 are disposed in the second active region RX2, the one second gate electrode 220 may surround the perimeter of the corresponding one second active pattern 210. The adjacent second gate electrodes 220 may be spaced apart from each other in the second direction D2. In some example embodiments, unlike the illustrated example, when the plurality of second active patterns 210 are disposed in the second active region RX2, the one second gate electrode 220 may also surround the perimeter of the plurality of second active patterns 210.

The first gate electrode 120 and the second gate electrode 220 disposed along the perimeter of the first active pattern 110 and the second active pattern 210 aligned in the first direction D1 may be directly connected to each other. Unlike the illustrated examples, a part of the first gate electrode 120 may be directly connected to the second gate electrode 220, but the remaining first gate electrode 120 may be separated from the second gate electrode 220 in the second direction D2.

Each of the first gate electrode 120 and the second gate electrode 220 may include, for example, at least one selected from the group consisting of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V) and a combination thereof, and each of the first gate electrode 120 and the second gate electrode 120 may include the same, or different, materials.

Each of the first gate electrode 120 and the second gate electrode 220 may include conductive metal oxide, conductive metal oxynitride or the like, and may include an oxidized form of the aforementioned material.

The first gate insulating layer 130 may be disposed on the field separation pattern 105. The first gate insulating layer 130 may extend between the first active pattern 110 and the first gate electrode 120 and between the first gate electrode 120 and the first lower epitaxial pattern 150BEP.

The first gate insulating layer 130 includes a sidewall portion 130S extending along the first active pattern 110 and a bottom portion 130B extending along the upper surface 150BEP_US of the first lower epitaxial pattern. The sidewall portion 130S of the first gate insulating layer may cover a part of each of the first long sidewall 110_LW1 of the first active pattern, the second long sidewall 110_LW2 of the first active pattern, the first short sidewall 110_SW1 of the first active pattern, and the second short sidewall 110_SW2 of the first active pattern. In plan view, the first gate insulating layer 130 may surround the perimeter of the first active pattern 110.

The second gate insulating layer 230 may be disposed on the field separation pattern 105. The second gate insulating layer 230 may extend between the second active pattern 210 and the second gate electrode 220 and between the second gate electrode 220 and the second lower epitaxial pattern 250BEP.

The second gate insulating layer 230 includes a sidewall portion 230S extending along the second active pattern 210 and a bottom portion 230B extending along a upper surface 250BEP_US of the second lower epitaxial pattern. The sidewall portion 230S of the second gate insulating layer may cover a part of each of the first long sidewall 210_LW1 of the second active pattern, the second long sidewall 210_LW2 of the second active pattern, the first short sidewall 210_SW1 of the second active pattern, and the second short sidewall 210_SW2 of the second active pattern. In plan view, the second gate insulating layer 230 may surround the perimeter of the second active pattern 210.

For example, in a cross-sectional view taken along the second direction D2, each of the first gate insulating layer 130 and the second gate insulating layer 230 may have an "L" shape (or, a flipped "L" shape).

The uppermost surface of the first gate insulating layer 130 is illustrated as being coplanar with the upper surface 120_US of the first gate electrode, but is not limited thereto. In addition, although the uppermost surface of the second gate insulating layer 230 is illustrated as being coplanar with the upper surface 220_US of the second gate electrode, some example embodiments are not limited thereto.

The first gate insulating layer 130 and the second gate insulating layer 230 disposed along the perimeter of the first active pattern 110 and the second active pattern 210 aligned in the first direction D1 may be directly connected to each other. Unlike the illustrated example, a part of the first gate insulating layer 130 may be directly connected to the second gate insulating layer 230, but the remaining first gate insulating layer 130 may be separated from the second gate insulating layer 230 in the second direction D2.

Unlike the illustrated example, although the first gate electrode 120 and the second gate electrode 220 that are disposed along the perimeter of the first active pattern 110 and the second active pattern 210 aligned in the first direction D1 are separated, the corresponding first gate insulating layer 130 and second gate insulating layer 230 may be directly connected. In addition, for example, in FIG. 2, the first gate electrodes 120 are separated in the second direction D2, but the first gate insulating layers 130 corresponding to the respective first gate electrodes 120 may not be separated but may be directly connected to each other.

Each of the first gate insulating layer 130 and the second gate insulating layer 230 may include silicon oxide, silicon oxynitride, silicon nitride, or a high-k material having a dielectric constant greater than that of silicon oxide, and may include the same, or different, materials. The high-k material may include, for example, at least one selected from the group consisting of boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

The semiconductor device according to some example embodiments may include a negative capacitor (NC) FET using a negative capacitor (NC). For example, each of the first and second gate insulating layers 130 and 230 may include a ferroelectric material layer having ferroelectric properties and a paraelectric material layer having paraelectric properties.

The ferroelectric material layer may have a negative capacitance, and the paraelectric material layer may have a positive capacitance. For example, when two or more capacitors are connected in series and the capacitance of each capacitor has a positive value, the total capacitance becomes smaller than the capacitance of each capacitor. However, when at least one of the capacitances of two or more capacitors connected in series has a negative value, the total capacitance may have a positive value and may be greater than the absolute value of each capacitance.

When a ferroelectric material layer having a negative capacitance and a paraelectric material layer having a positive capacitance are connected in series, the total capacitance value of the ferroelectric material layer and the paraelectric material layer connected in series may increase. By using the principle that the total capacitance value is increased, the transistor containing the ferroelectric material layer may have a subthreshold swing (SS) lower than or equal to a threshold voltage lower than 60 mV/decade at room temperature.

The ferroelectric material layer may have ferroelectric properties. The ferroelectric material layer may include, for example, at least one of hafnium oxide, hafnium zirconium oxide, barium strontium titanium oxide, barium titanium oxide, or lead zirconium titanium oxide. In this case, as one example, the hafnium zirconium oxide may be a material containing hafnium oxide doped with zirconium (Zr). As another example, the hafnium zirconium oxide may be a compound of hafnium (Hf), zirconium (Zr), and oxygen (O).

The ferroelectric material layer may further include a dopant doped therein. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), or tin (Sn). The type of dopant included in the ferroelectric material layer may vary depending on which ferroelectric material is included in the ferroelectric material layer.

When the ferroelectric material layer includes hafnium oxide, the dopant included in the ferroelectric material layer may include, for example, at least one of gadolinium (Gd), silicon (Si), zirconium (Zr), aluminum (Al), or yttrium (Y).

When the dopant is aluminum (Al), the ferroelectric material layer may include 3 to 8 atomic percent (at %) of aluminum. In this case, the ratio of the dopant may be a ratio of aluminum to the sum of hafnium and aluminum.

When the dopant is silicon (Si), the ferroelectric material layer may include 2 to 10 at % of silicon. When the dopant is yttrium (Y), the ferroelectric material layer may include 2 to 10 at % of yttrium. When the dopant is gadolinium (Gd), the ferroelectric material layer may include 1 to 7 at % of gadolinium. When the dopant is zirconium (Zr), the ferroelectric material layer may include 50 to 80 at % of zirconium.

The paraelectric material layer may have paraelectric properties. The paraelectric material layer may include, for example, at least one of silicon oxide or metal oxide having a high dielectric constant. The metal oxide included in the paraelectric material layer may include, for example, at least one of hafnium oxide, zirconium oxide, or aluminum oxide, but is not limited thereto.

The ferroelectric material layer and the paraelectric material layer may include the same material. The ferroelectric material layer may have ferroelectric properties, but the paraelectric material layer may not have ferroelectric properties. For example, when the ferroelectric material layer and the paraelectric material layer include hafnium oxide, the crystal structure of the hafnium oxide included in the ferroelectric material layer is different from the crystal structure of the hafnium oxide included in the paraelectric material layer.

The ferroelectric material layer may have a thickness that exhibits ferroelectric properties. The thickness of the ferroelectric material layer may be, for example, in a range of 0.5 to 10 nm, but is not limited thereto. Since a critical thickness at which each ferroelectric material exhibits ferroelectric properties may be different, the thickness of the ferroelectric material layer may vary depending on the ferroelectric material.

In some example embodiments, each of the first and second gate insulating layers 130 and 230 may include one ferroelectric material layer. In some example embodiments, each of the first and second gate insulating layers 130 and 230 may include a plurality of ferroelectric material layers spaced apart from each other. Each of the first and second gate insulating layers 130 and 230 may have a laminated layer structure in which a plurality of ferroelectric material layers and a plurality of paraelectric material layers are alternately laminated.

The first upper epitaxial pattern 150UEP may be disposed on the first active pattern 110. The first upper epitaxial pattern 150UEP is connected to the upper surface 110_US of the first active pattern.

The second upper epitaxial pattern 250UEP may be disposed on the second active pattern 210. The second upper epitaxial pattern 250UEP is connected to the upper surface 210_US of the second active pattern.

Each of the first upper epitaxial pattern 150UEP and the second upper epitaxial pattern 250UEP may be an epitaxial semiconductor pattern formed by a selective epitaxial growth process. The first upper epitaxial pattern 150UEP may be formed at the same time as, earlier than, or later than the second upper epitaxial pattern 250UEP. The first upper epitaxial pattern 150UEP may include the same, or different, material than that of the first lower epitaxial pattern 150BEP. The second upper epitaxial pattern 250UEP may include the same, or different, material than that of the second lower epitaxial pattern 250BEP. Each of the first upper epitaxial pattern 150UEP and the second upper epitaxial pattern 250UEP may be included in the source/drain of the vertical transistor.

The semiconductor device according to some example embodiments may include vertical transistors in which carriers (such as electrons or holes) move in the third direction D3. For example, when a voltage is applied to the gate electrodes 120 and 220 to turn on the transistor, carriers may move from the lower epitaxial patterns 150BEP and 250BEP to the upper epitaxial patterns 150UEP and 250UEP through the first and second active patterns 110 and 210. The gate electrodes 120 and 220 according to some example embodiments may completely surround a part of sidewalls of the first and second active patterns 110 and 210. The transistor according to some example embodiments may be a 3D field effect transistor (e.g., a VFET) having a gate all around structure. Since the gate surrounds the channel, the semiconductor device according to some example embodiments may have improved or excellent electrical characteristics.

Each of the first spacer 140 and the second spacer 240 may be disposed on the field separation pattern 105. The first spacer 140 may cover the first gate electrode 120, the first active pattern 110, and the first upper epitaxial pattern 150UEP. The second spacer 240 may cover the second gate electrode 220, the second active pattern 210, and the second upper epitaxial pattern 250UEP.

The first spacer 140 and the second spacer 240 may be directly connected on the field separation pattern 105. The first spacer 140 may include a first lower spacer 140L, a first gate spacer 140G, and a first upper spacer 140T. The second spacer 240 may include a second lower spacer 240L, a second gate spacer 240G, and a second upper spacer 240T. Since the description of the first spacer 140 is substantially the same as the description of the second spacer 240, the first spacer 140 will be described below.

The first lower spacer 140L may cover the upper surface of the field separation pattern 105. The first gate electrode 120 may be spaced apart from the field separation pattern 105 in the third direction D3 by the first lower spacer 140L. The first lower spacer 140L is interposed between the first gate electrode 120 and the first lower epitaxial pattern 150BEP.

The first gate spacer 140G may cover the upper surface 120_US of the first gate electrode and the sidewall of the first gate electrode 120. The first upper spacer 140T may extend along a sidewall of the first upper epitaxial pattern 150UEP. The first upper spacer 140T does not cover the upper surface 150UEP_US of the first upper epitaxial pattern.

Each of the first spacer 140 and the second spacer 240 may each include, for example, at least one of silicon nitride (SiN), silicon oxynitride (SiON), silicon oxide ($SiO_2$), silicon oxynitride (SiOCN), silicon boron nitride (SiBN), silicon oxyboron nitride (SiOBN), silicon oxycarbide (SiOC), or a combination thereof, and the first spacer 140 and the second spacer 240 may include the same, or different materials. For example, each of the first lower spacer 140L, the first gate spacer 140G, and the first upper spacer 140T may be formed of a single layer or a multilayer.

The first interlayer insulating layer 191 may be disposed on the first spacer 140 and the second spacer 240. A upper surface of the first interlayer insulating layer 191 may be coplanar with the upper surface 150UEP_US of the first upper epitaxial pattern and the upper surface 250UEP_US of the second upper epitaxial pattern.

The second interlayer insulating layer 192 and the third interlayer insulating layer 193 may be sequentially disposed on the first interlayer insulating layer 191.

Each of the first interlayer insulating layer 191, the second interlayer insulating layer 192, and the third interlayer insulating layer 193 may independently or collectively include, for example, at least one of silicon oxide, silicon nitride, silicon oxynitride, and a low-k material. The low-k material may include, for example, fluorinated tetraethylorthosilicate (FTEOS), hydrogen silsesquioxane (HSQ), bisbenzocyclobutene (BCB), tetramethylorthosilicate (TMOS), octamethyleyclotetrasiloxane (OMCTS), hexamethyldisiloxane (HMDS), trimethylsilyl borate (TMSB), diacetoxyditertiarybutosiloxane (DADBS), trimethylsilil phosphate (TMSP), polytetrafluoroethylene (PTFE), tonen silazene (TOSZ), fluoride silicate glass (FSG), polyimide nanofoams such as polypropylene oxide, carbon doped silicon oxide (CDO), organo silicate glass (OSG), SiLK, amorphous fluorinated carbon, silica aerogels, silica xerogels, mesoporous silica, or a combination thereof, but is not limited thereto.

Each of the first upper epitaxial contact 170 and the second upper epitaxial contact 270 may be disposed in the second interlayer insulating layer 192. The first upper epitaxial contact 170 may be connected to the first upper epitaxial pattern 150UEP. The second upper epitaxial contact 270 may be connected to the second upper epitaxial pattern 250UEP. In FIGS. 2 and 3, although the first upper epitaxial contact 170 and the second upper epitaxial contact 270 are illustrated as being connected to the plurality of first upper epitaxial patterns 150UEP and the second upper epitaxial pattern 250UEP, this is only for simplicity of description and some example embodiments is not limited thereto.

Each of the first lower epitaxial contact 171 and the second lower epitaxial contact 271 may sequentially penetrate the second interlayer insulating layer 192, the first interlayer insulating layer 191, the spacers 140 and 240, and the field separation pattern 105. The first lower epitaxial contact 171 may be connected to the first lower epitaxial pattern 150BEP. The second lower epitaxial contact 271 may be connected to the second lower epitaxial pattern 250BEP.

The gate contact 175 may sequentially penetrate the second interlayer insulating layer 192, the first interlayer insulating layer 191, and the spacers 140 and 240. The gate contact 175 may be connected to the gate electrodes 120 and 220.

The source/drain via 181, the gate via 182, and the wiring line 185 may be disposed in the third interlayer insulating layer 193. The source/drain via 181 may be connected to the first upper epitaxial contact 170, the second upper epitaxial contact 270, the first lower epitaxial contact 171, and the second lower epitaxial contact 271. The gate via 182 may be connected to the gate contact 175. The wiring line 185 may be connected to the source/drain via 181 and the gate via 182.

Although each of the first upper epitaxial contact 170, the second upper epitaxial contact 270, the first lower epitaxial contact 171, the second lower epitaxial contact 271, the source/drain via 181, the gate via 182, and the wiring line 185 is illustrated as a single layer, this is only for simplicity of description and some example embodiments is not limited thereto.

In some example embodiments, some of the first upper epitaxial contact 170, the second upper epitaxial contact 270, the first lower epitaxial contact 171, the second lower epitaxial contact 271, the source/drain via 181, the gate via 182, and the wiring line 185 may have a single layer structure. In addition, the remainder of the first upper epitaxial contact 170, the second upper epitaxial contact 270, the first lower epitaxial contact 171, the second lower epitaxial contact 271, the source/drain via 181, the gate via 182, and the wiring line 185 may have a multilayer structure including a barrier conductive layer and a plug conductive layer. In some example embodiments, each of the first upper epitaxial contact 170, the second upper epitaxial contact 270, the first lower epitaxial contact 171, the second lower epitaxial contact 271, the source/drain via 181, the gate via 182, and the wiring line 185 may have a multilayer structure including a barrier conductive layer and a plug conductive layer.

Each of the contacts 170, 171, 175, 270, and 271, the vias 181 and 182, and the wiring line 185 may include a conductive material, and, for example, may independently or concurrently include at least one of a metal, a metal nitride, a metal carbonitride, a two-dimensional (2D) material, or a conductive semiconductor material.

Figure 5:
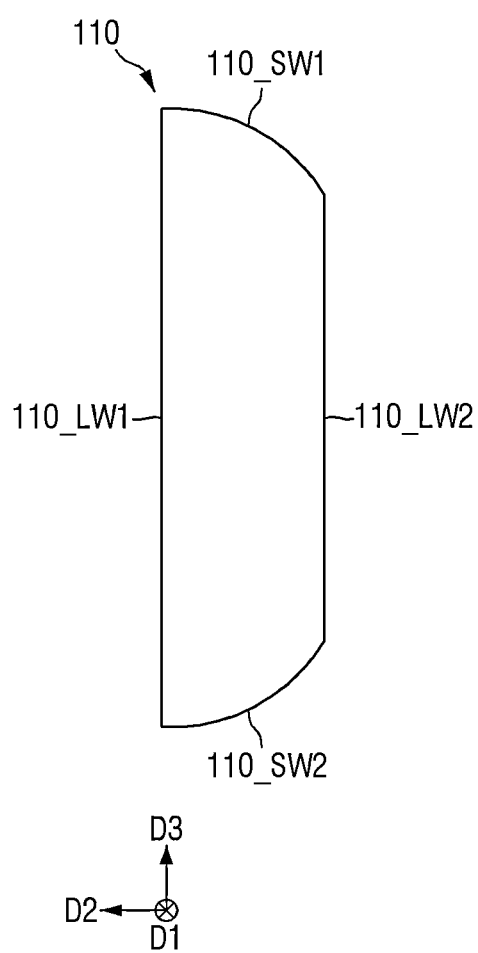
FIGS. 5 and 6 are diagrams each illustrating a semiconductor device according to some example embodiments.
Figure 6:
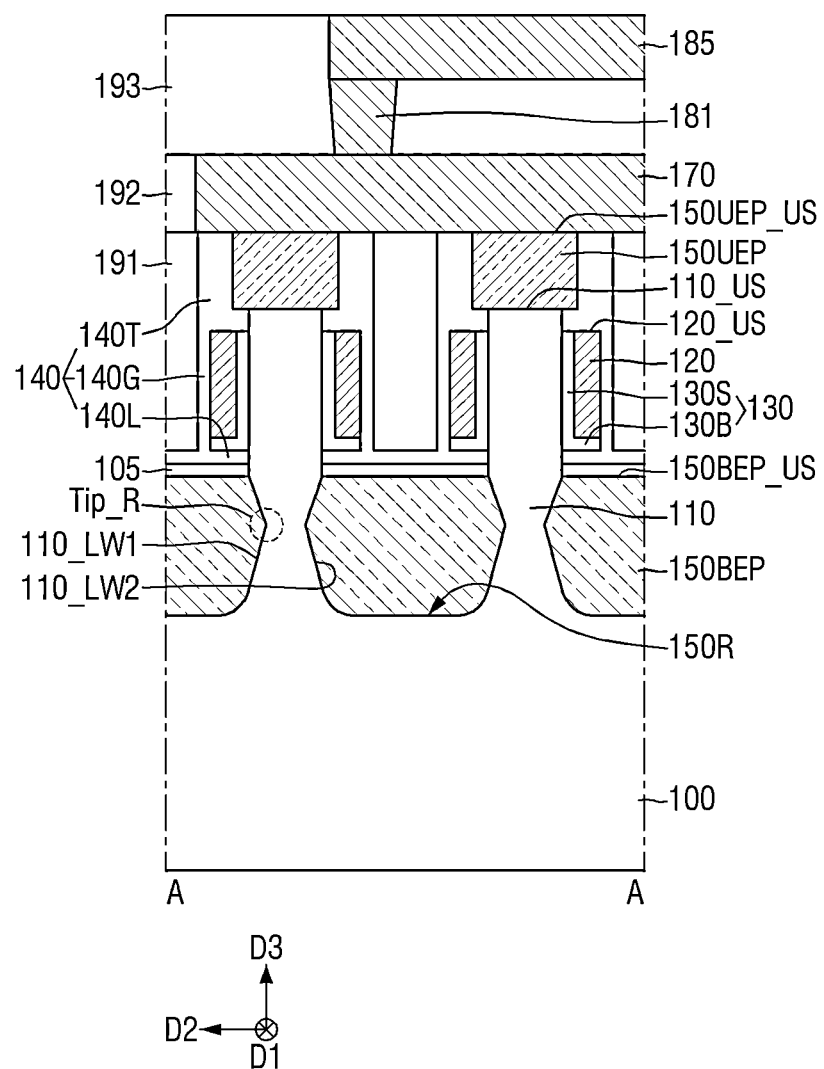

FIGS. 5 and 6 are diagrams each illustrating a semiconductor device according to some example embodiments. For simplicity of description, the following description will focus on differences from the description with reference to FIGS. 1 to 4.

For reference, FIG. 5 is a view illustrating a upper surface of the first active pattern, and FIG. 6 is an example cross-sectional view taken along line A-A of FIG. 1.

Referring to FIG. 5, in a semiconductor device according to some example embodiments, in plan view, as moving from the first long sidewall 110_LW1 of the first active pattern to the second long sidewall 110_LW2 of the first active pattern, the width of the first active pattern 110 in the first direction D1 may continuously decrease.

Although not illustrated, the upper surface of the first active pattern 110 may have the shape illustrated in FIG. 5 and the shape illustrated in FIG. 1.

In addition, the upper surface of the second active pattern 210 of FIG. 1 may have the shape illustrated in FIG. 5. In addition, the upper surface of the second active pattern 210 may have the shape illustrated in FIG. 5 and the shape illustrated in FIG. 1.

Referring to FIG. 6, in a semiconductor device according to some example embodiments, each of the first long sidewall 110_LW1 of the first active pattern and the second long sidewall 110_LW2 of the first active pattern may include a tip region Tip_R.

The first active pattern 110 may include a portion in which the width thereof in the second direction D2 decreases and then increases as moving away from the substrate 100. A portion in which the width of the first active pattern 110 decreases and then increases in the second direction may be the tip region Tip_R.

Although not illustrated, as one example, the first long sidewall 210_LW1 of the second active pattern and the second long sidewall 210_LW2 of the second active pattern may also include the tip region Tip_R. As another example, the first long sidewall 210_LW1 of the second active pattern and the second long sidewall 210_LW2 of the second active pattern may not include a tip region.

Figure 7:
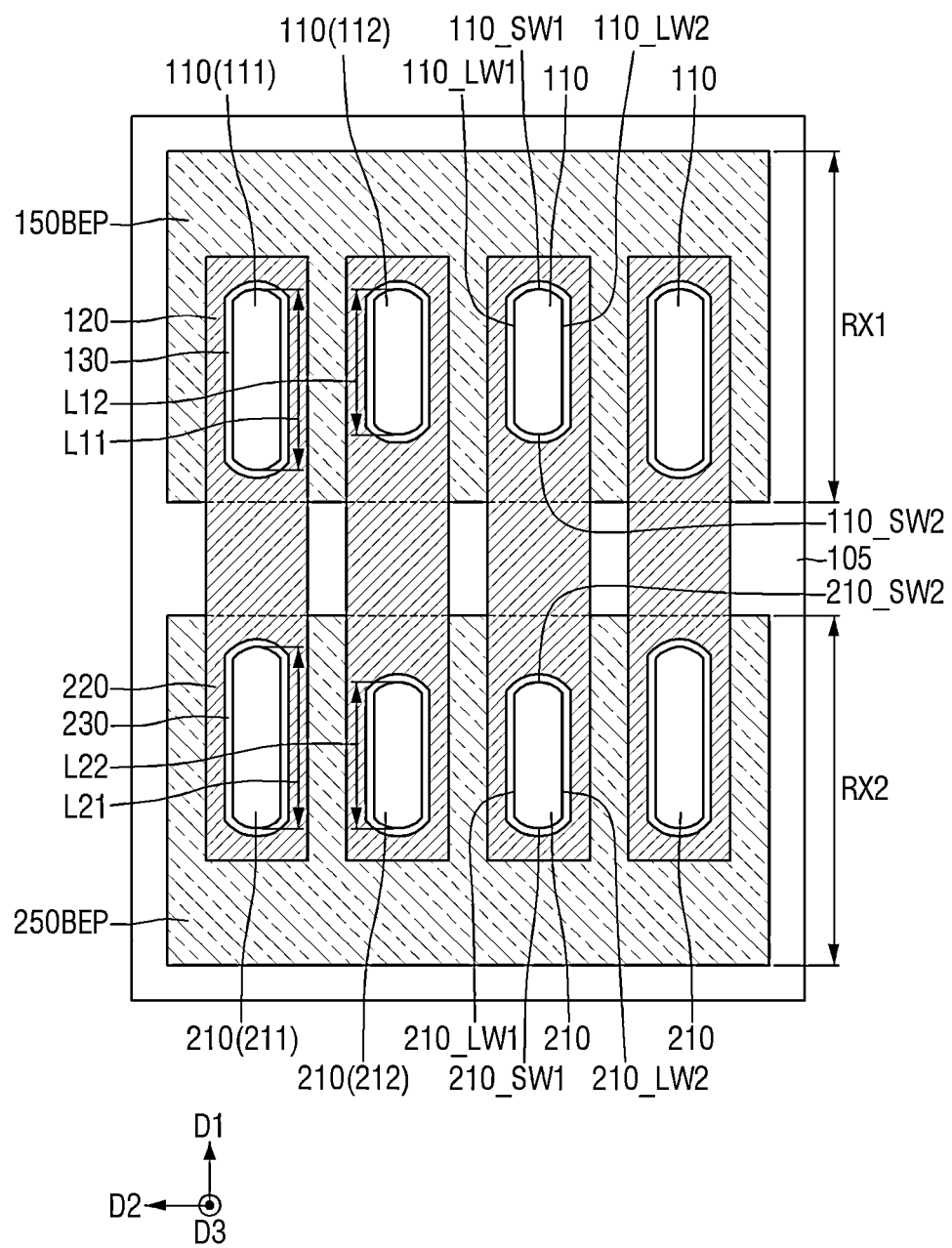
FIG. 7 is an example plan view illustrating a semiconductor device according to some example embodiments.

FIG. 7 is an example plan view illustrating a semiconductor device according to some example embodiments. For simplicity of description, the following description will focus on differences from the description with reference to FIGS. 1 to 4.

For reference, the cross-sectional views taken along lines A-A, B-B, and C-C of FIG. 1 may be directly applied to example embodiments described with reference to FIG. 7.

Referring to FIG. 7, in a semiconductor device according to some example embodiments, the first active pattern 110 may include a first long active pattern 111 and a first short active pattern 112. The second active pattern 210 may include a second long active pattern 211 and a second short active pattern 212.

The first long active pattern 111 and the first short active pattern 112 are spaced apart from each other in the second direction D2. The first long active pattern 111 may have a first length L11 in the first direction DE The first short active pattern 112 may have a second length L12 smaller than the first length L11 in the first direction D1.

The second long active pattern 211 and the second short active pattern 212 are spaced apart from each other in the second direction D2. The second long active pattern 211 may have a third length L21 in the first direction D1. The second short active pattern 212 may have a fourth length L22 smaller than the third length L21 in the first direction D1.

For example, the first length L11 of the first long active pattern 111 may be substantially the same as the third length L21 of the second long active pattern 211. The second length L12 of the first short active pattern 112 may be substantially the same as the fourth length L22 of the second short active pattern 212.

Each of the first long active pattern 111 and the first short active pattern 112 may include the first long sidewall 110_LW1 and the second long sidewall 110_LW2, and the first short sidewall 110_SW1 and the second short sidewall 110_SW2. Each of the second long active pattern 211 and the second short active pattern 212 may include the first long sidewall 210_LW1 and the second long sidewall 210_LW2, and the first short sidewall 210_SW1 and the second short sidewall 210_SW2.

Each of the short sidewalls 110_SW1 and 110_SW2 of the first long active pattern 111 and the first short active pattern 112 may have a curved surface. Each of the short sidewalls 210_SW1 and 210_SW2 of the second long active pattern 211 and the first short active pattern 212 may have a curved surface.

Although the first long active pattern 111 is illustrated as being aligned with the second long active pattern 211 in the first direction D1, some example embodiments is not limited thereto. In addition, although the first short active pattern 112 is illustrated as being aligned with the second short active pattern 212 in the first direction D1, some example embodiments is not limited thereto.

The description of the first long active pattern 111 and the first short active pattern 112 and the description of the second long active pattern 211 and the second short active pattern 212 are substantially the same as the description of the first active pattern 110 and the second active pattern 210 described with reference to FIGS. 1 to 4.

The first lower epitaxial pattern 150BEP may be disposed between the first long active pattern 111 and the first short active pattern 112. In plan view, the first lower epitaxial pattern 150BEP may surround the perimeter of the first long active pattern 111 and the perimeter of the first short active pattern 112.

The second lower epitaxial pattern 250BEP may be disposed between the second long active pattern 211 and the second short active pattern 212. In plan view, the second lower epitaxial pattern 250BEP may surround the perimeter of the second long active pattern 211 and the perimeter of the second short active pattern 212.

The first gate electrode 120 may surround the perimeter of the first long active pattern 111. In addition, the first gate electrode 120 may surround the perimeter of the first short active pattern 112. The first gate electrode 120 surrounding the perimeter of the first long active pattern 111 may be spaced apart from the first gate electrode 120 surrounding the perimeter of the first short active pattern 112 in the second direction D2.

The relationship between the first gate electrode 120 and the first long active pattern 111 and the relationship between the first gate electrode 120 and the first short active pattern 112 are substantially the same as the relationship between the first active pattern 110 and the first gate electrode 120 described with reference to FIGS. 1 to 4. The relationship between the second gate electrode 220 and the second long active pattern 211 and the relationship between the second gate electrode 220 and the second short active pattern 212 are substantially the same as the relationship between the second active pattern 210 and the second gate electrode 220 described with reference to FIGS. 1 to 4.

As depicted in FIGS. 2 to 4, the first upper epitaxial pattern 150UEP is disposed on the first long active pattern 111 and the first short active pattern 112. The second upper epitaxial pattern 250UEP is disposed on the second long active pattern 211 and the second short active pattern 212.

Figure 8A:
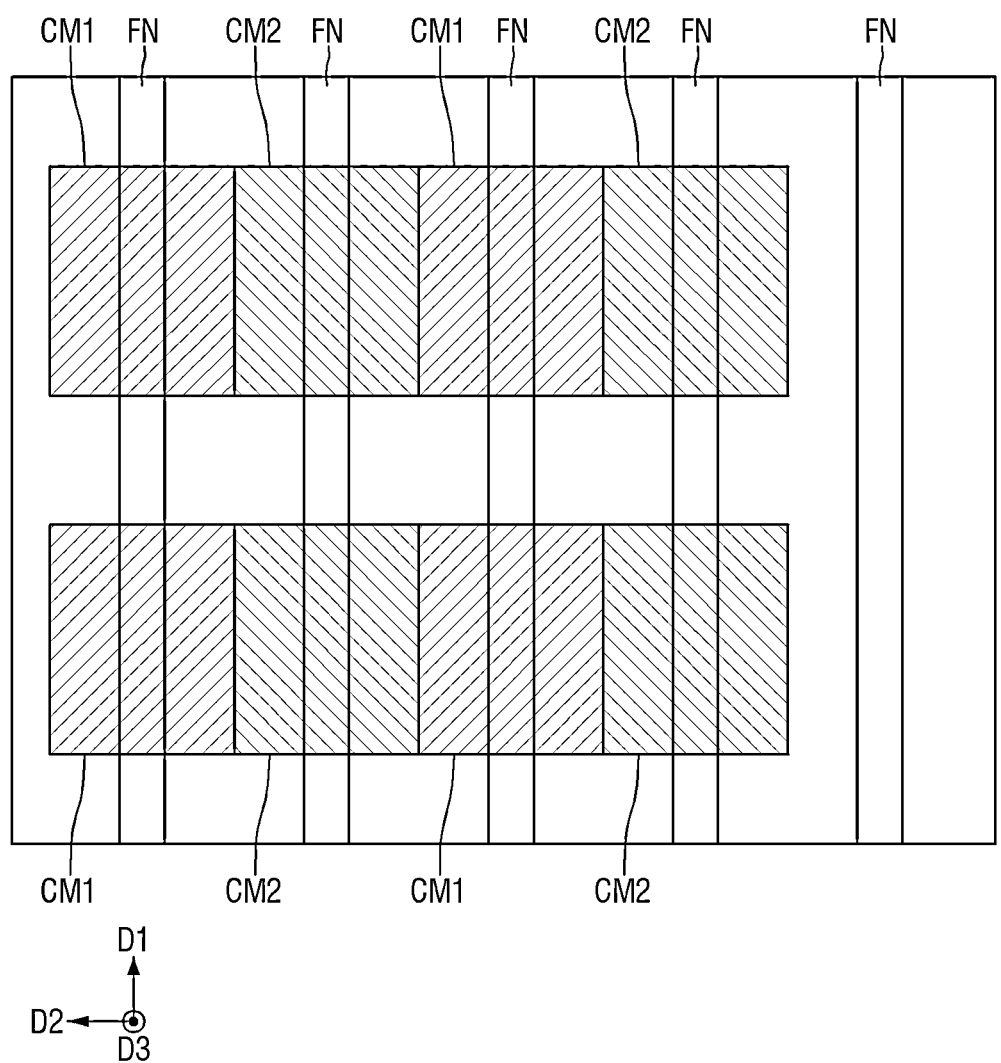
FIGS. 8A to 8C are views describing a method of disposing a layout of a semiconductor device according to some example embodiments, respectively.
Figure 8B:
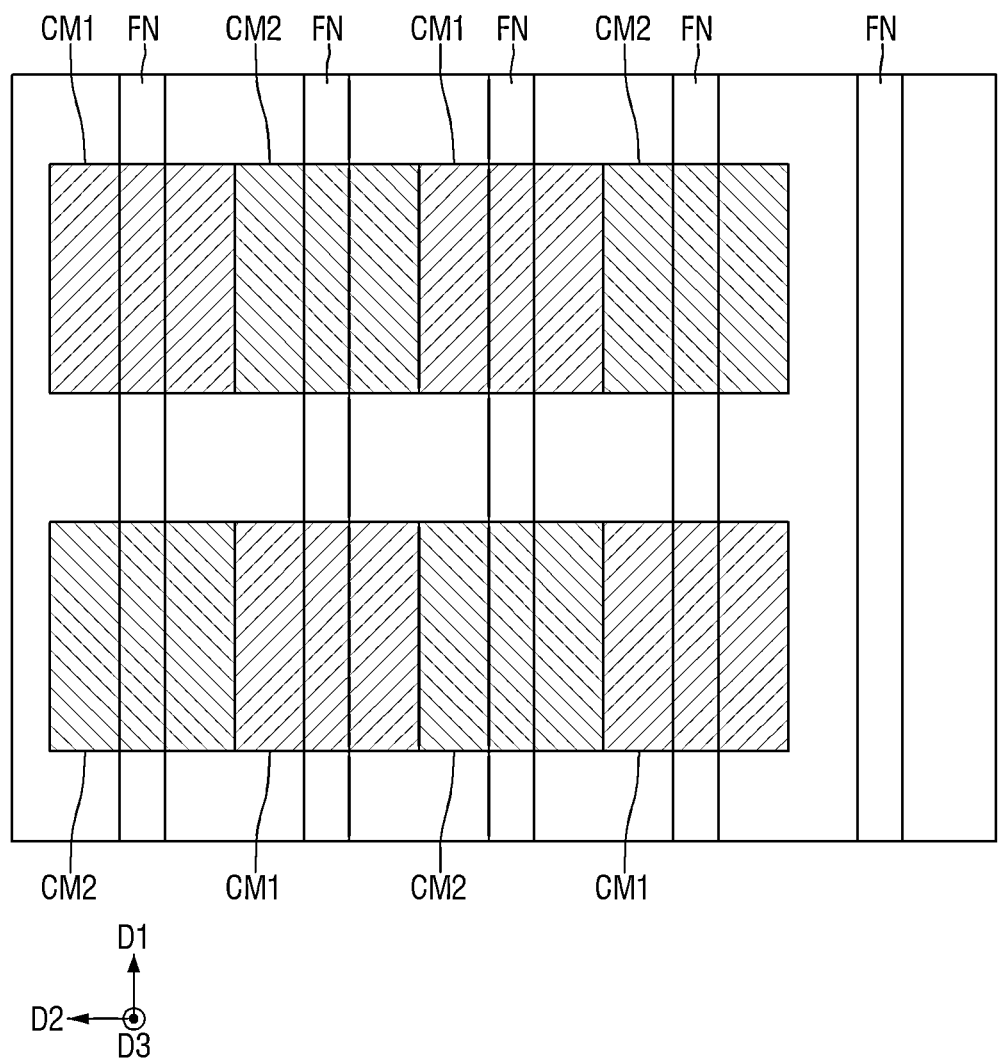
Figure 8C:
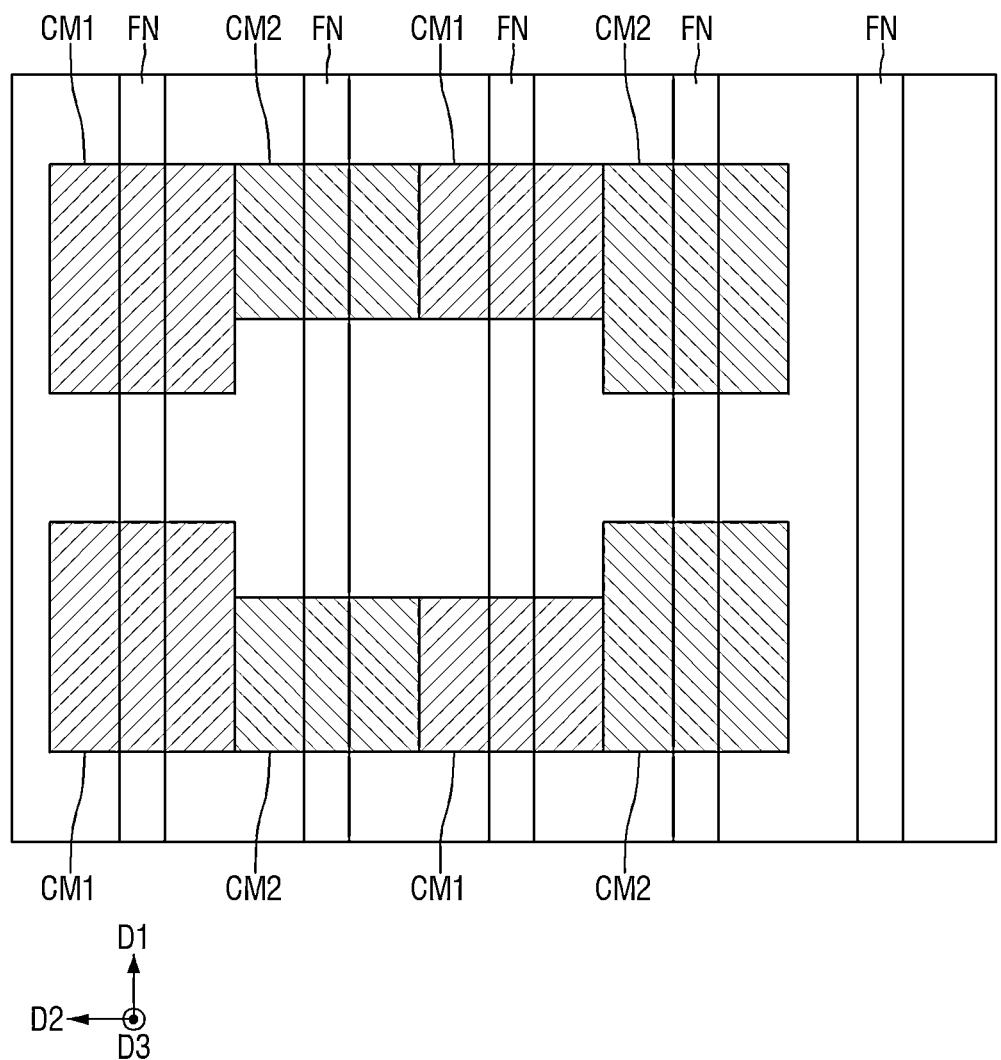

FIGS. 8A to 8C are views describing a method of disposing/drawing a layout of a semiconductor device according to some example embodiments, respectively.

Referring to FIGS. 8A to 8C, a fin layer pattern FN extending in the first direction D1 may be disposed. The adjacent fin layer patterns FN may be spaced apart from each other in the second direction D2.

The fin layer pattern FN may be related to a fin mask pattern 10 of FIG. 9A, which will be described later.

In FIG. 8A, a first active layer pattern CM1 may be disposed on the first fin layer pattern FN. For example, the first active layer patterns CM1 spaced apart in the second direction D2 may be disposed on the first fin layer pattern FN.

The first active layer pattern CM1 does not cross two or more of the fin layer patterns FN adjacent in the second direction D2.

The first active layer pattern CM1 may be related to a first mask pattern 11 of FIG. 10A, which will be described later.

A second active layer pattern CM2 may be disposed on the second fin layer pattern FN closest to the first fin layer pattern FN in the second direction D2. For example, the second active layer patterns CM2 spaced apart in the second direction D2 may be disposed on the second fin layer pattern FN. The second active layer pattern CM2 does not cross two or more of the fin layer patterns FN adjacent in the second direction D2.

The second active layer pattern CM2 may be related to a second mask pattern 12 of FIG. 11A, which will be described later.

For example, one type of the active layer pattern CM1 or CM2 may be disposed on the one fin layer pattern FN.

In FIG. 8B, the first active layer pattern CM1 and the second active layer pattern CM2 spaced apart in the second direction D2 may be disposed on the first fin layer pattern FN.

For example, the first active layer pattern CM1 and the second active layer pattern CM2 may be simultaneously disposed on the one fin layer pattern FN.

The first active pattern 110 and the second active pattern 210 illustrated in FIG. 1 may be formed by using the disposition of the layout illustrated in FIGS. 8A and 8B.

In FIG. 8C, the first active layer pattern CM1 may include a plurality of active layer patterns having different widths in the first direction D1. In addition, the second active layer pattern CM2 may include a plurality of active layer patterns having different widths in the first direction D1.

The first active pattern 110 and the second active pattern 210 illustrated in FIG. 7 may be formed using the disposition of the layout illustrated in FIG. 8C.

Unlike the illustrated example in FIG. 8C, the first active layer pattern CM1 and the second active layer pattern CM2 may be simultaneously disposed on the one fin layer pattern FN.

The following description describes a method for fabricating a semiconductor device using the disposition of the layout illustrated in FIG. 8A. However, through the following description, a person of ordinary skill in the art of some example embodiments may easily infer a method for fabricating a semiconductor device using the disposition of the layouts illustrated in FIGS. 8B and 8C.

FIGS. 9A to 20 are diagrams illustrating the intermediate steps of a method for fabricating a semiconductor device according to some example embodiments.

Figure 9A:
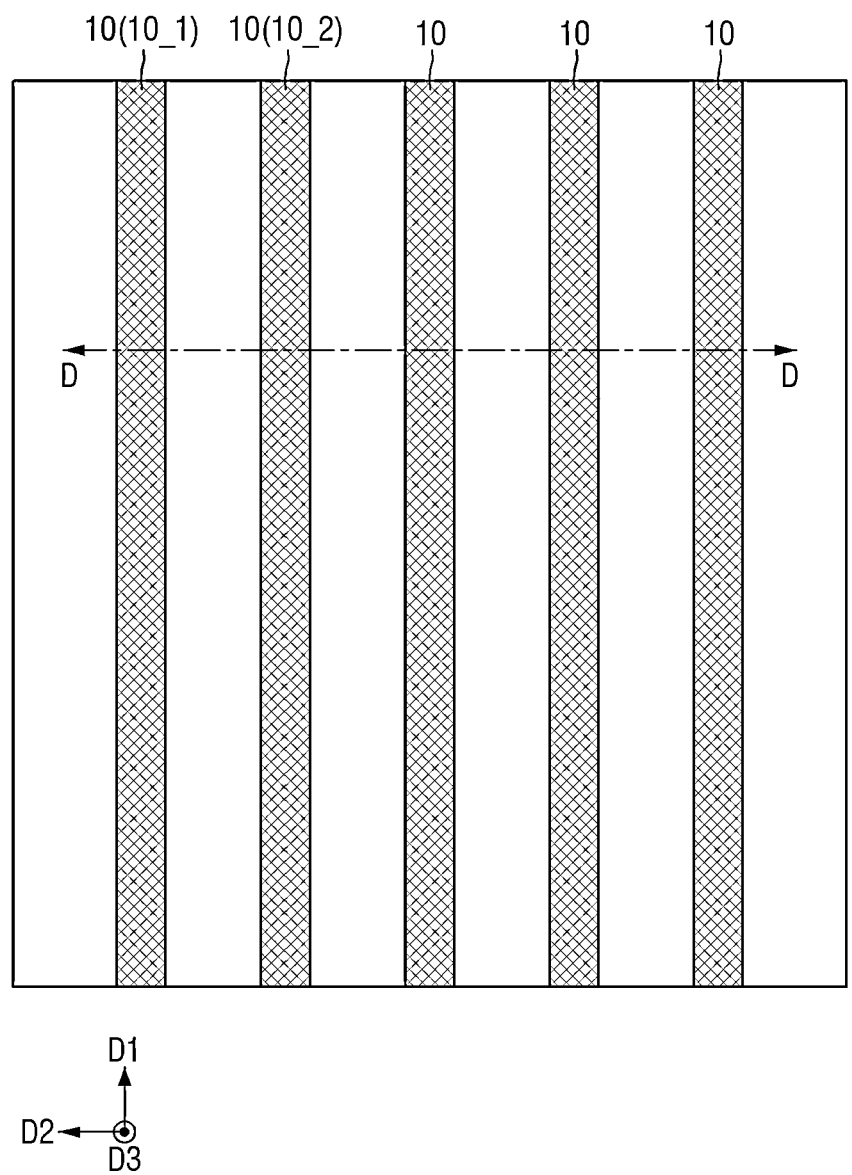
FIGS. 9A to 20 are diagrams illustrating the intermediate steps of a method for fabricating a semiconductor device according to some example embodiments.
Figure 9B:
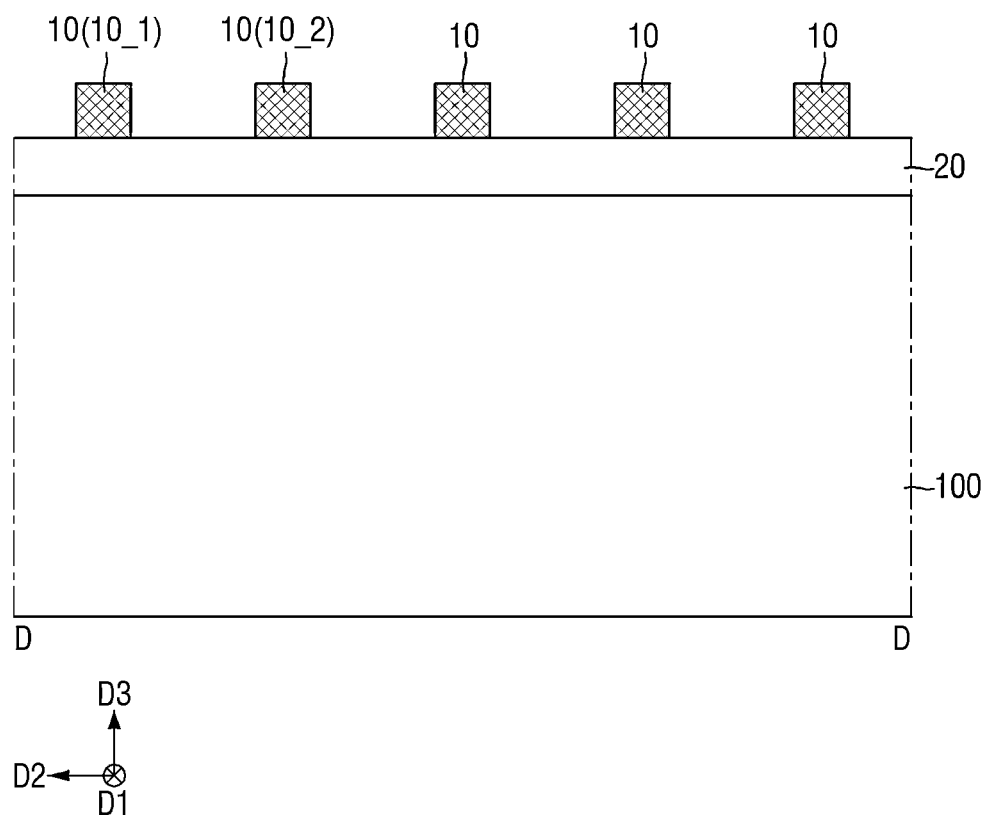

Referring to FIGS. 9A and 9B, a pattern capping layer 20 may be formed on the substrate 100.

The pattern capping layer 20 may include, for example, at least one of silicon nitride (SiN), silicon oxynitride (SiON), silicon oxide (SiO$_2$), silicon carbonitride (SiCN), silicon oxycarbonitride (SiOCN), or a combination thereof, but is not limited thereto. The pattern capping layer 20 may be formed with a growth process and/or a deposition process, such as but not limited to a vapor deposition process such as at least one of a low pressure chemical vapor deposition (LPCVD) process or a plasma enhanced chemical vapor deposition (PECVD) process; however, example embodiments are not limited thereto.

The fin mask pattern 10 elongated in the first direction D1 may be formed on the pattern capping layer 20. The fin mask pattern 10 is adjacent in the second direction D2.

The fin mask pattern 10 may include a first fin mask pattern 10_1 and a second fin mask pattern 10_2 that are immediately adjacent in the second direction D2. Here, "immediately adjacent" means/refers to that an additional fin mask pattern is not disposed between the first fin mask pattern 10_1 and the second fin mask pattern 10_2.

Figure 10A:
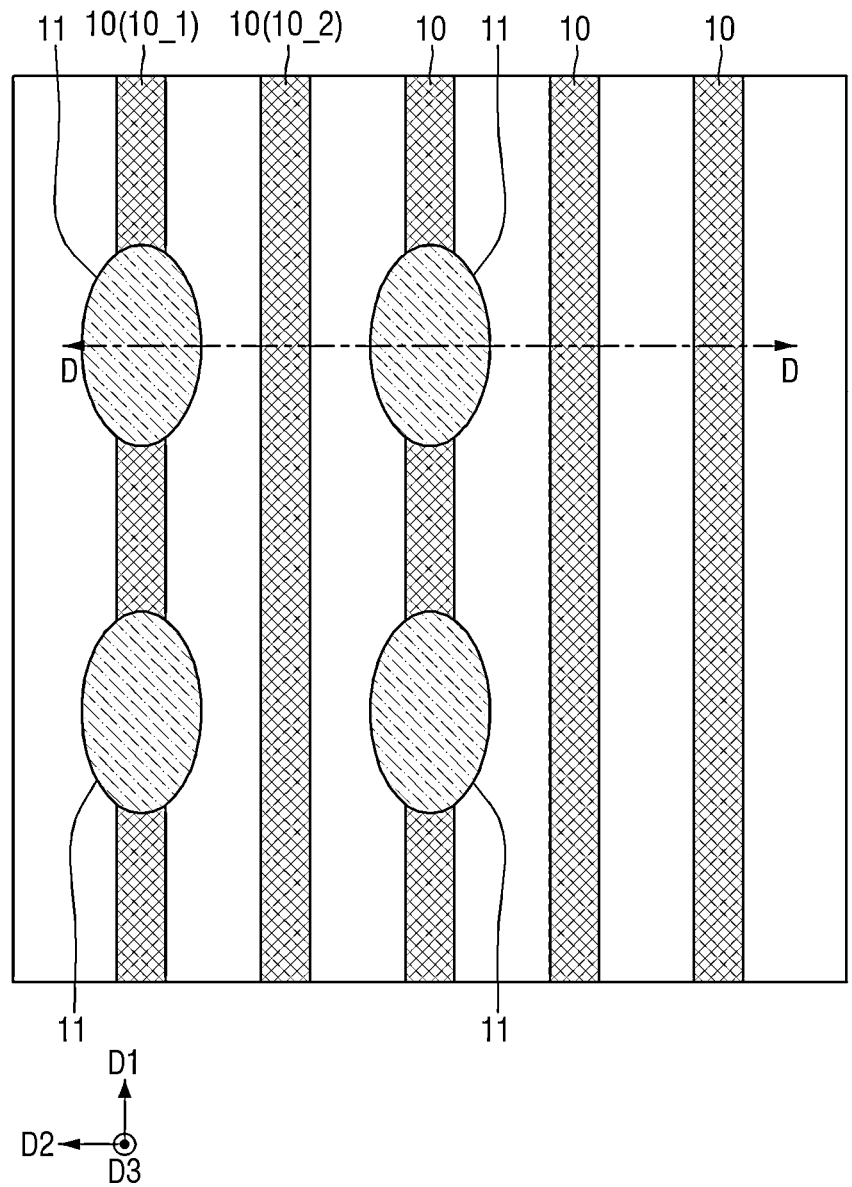
Figure 10B:
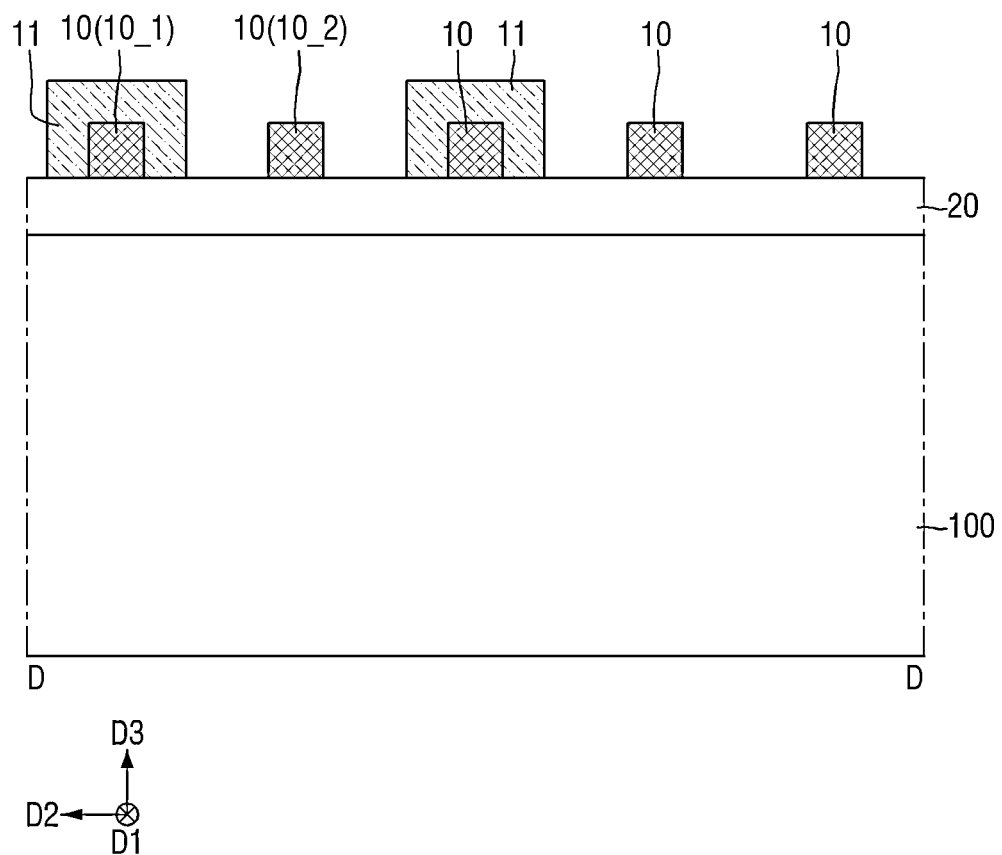

Referring to FIGS. 10A and 10B, the first mask pattern 11 may be formed on the substrate 100.

The first mask pattern 11 may be formed on the pattern capping layer 20. The first mask pattern 11 may cover a part of the first fin mask pattern 10_1. The first mask patterns 11 spaced apart in the second direction D2 may be formed on the first fin mask pattern 10_1. For example a film may be deposited (e.g. blanketly deposited) on the substrate 100, on top of the pattern capping layer 20 and on top of the fin mask pattern 10. Subsequently the film may be patterned and etched to form the first mask pattern 11.

The first mask pattern 11 does not simultaneously cover the fin mask pattern 10 immediately adjacent in the second direction D2.

In plan view, the first mask pattern 11 may have, for example, a circular shape and/or an elliptical shape extending in the first direction D1. This may be because the first active layer pattern CM1 of FIG. 8A related to the first mask pattern 11 has a contact type shape.

Figure 11B:
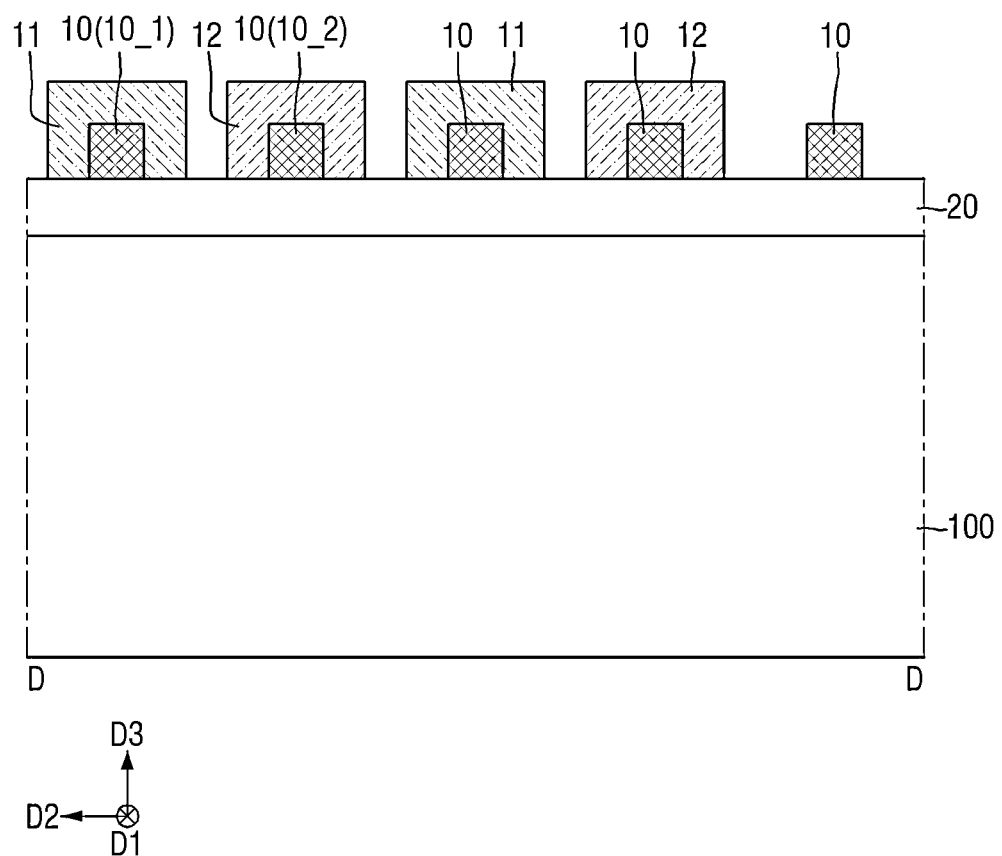

Referring to FIGS. 11A and 11B, the second mask pattern 12 may be formed on the substrate 100.

The second mask pattern 12 may be formed on the pattern capping layer 20. The second mask pattern 12 may cover a part of the second fin mask pattern 10_2. The second mask patterns 12 spaced apart in the second direction D2 may be formed on the second fin mask pattern 10_2.

The second mask pattern 12 does not simultaneously cover the fin mask pattern 10 immediately adjacent in the second direction D2.

In a plan view, the second mask pattern 12 may have, for example, a circular shape and/or an elliptical shape extending in the first direction D1.

The second mask pattern 12 covering a part of the second fin mask pattern 10_2 overlaps the first mask pattern 11 covering a part of the first fin mask pattern 10_1 in the second direction.

For example, the first mask pattern 11 and the second mask pattern 12 may not cover at least one of the fin mask patterns 10.

Figure 12A:
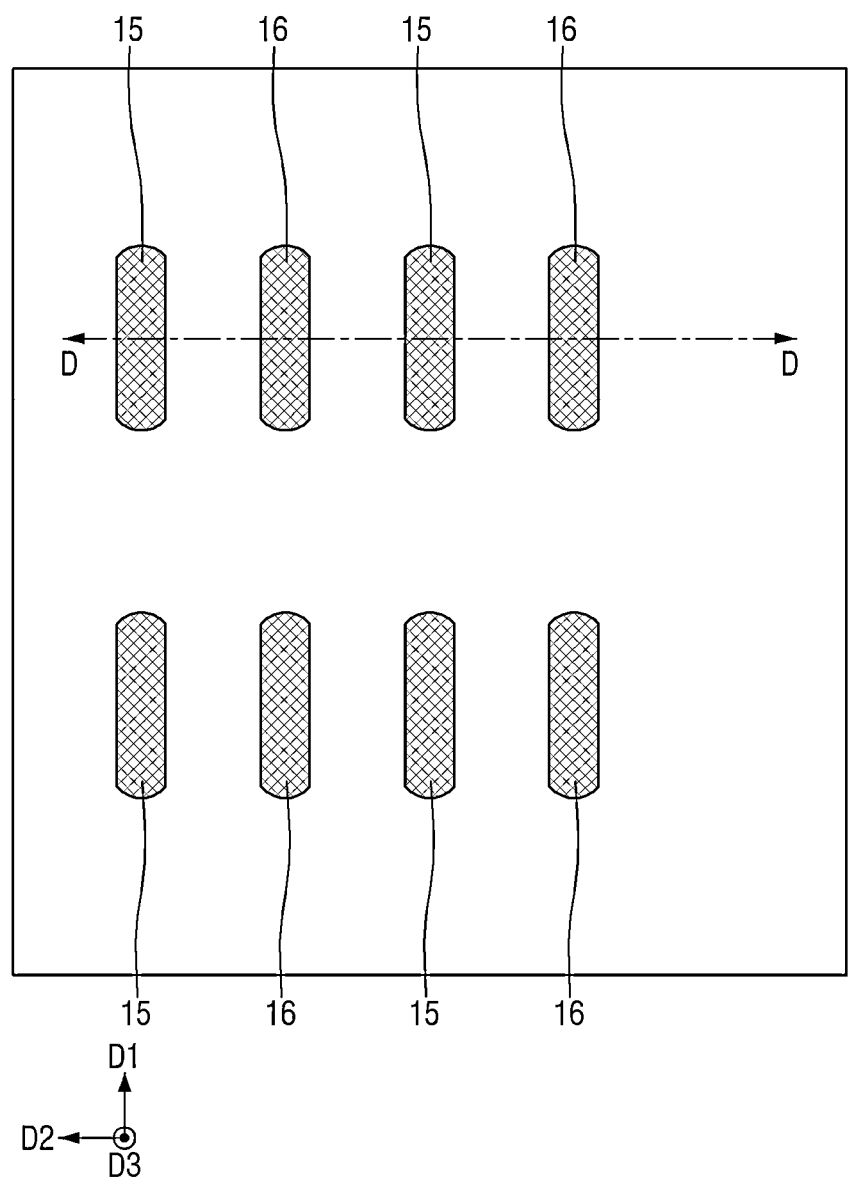
Figure 12B:
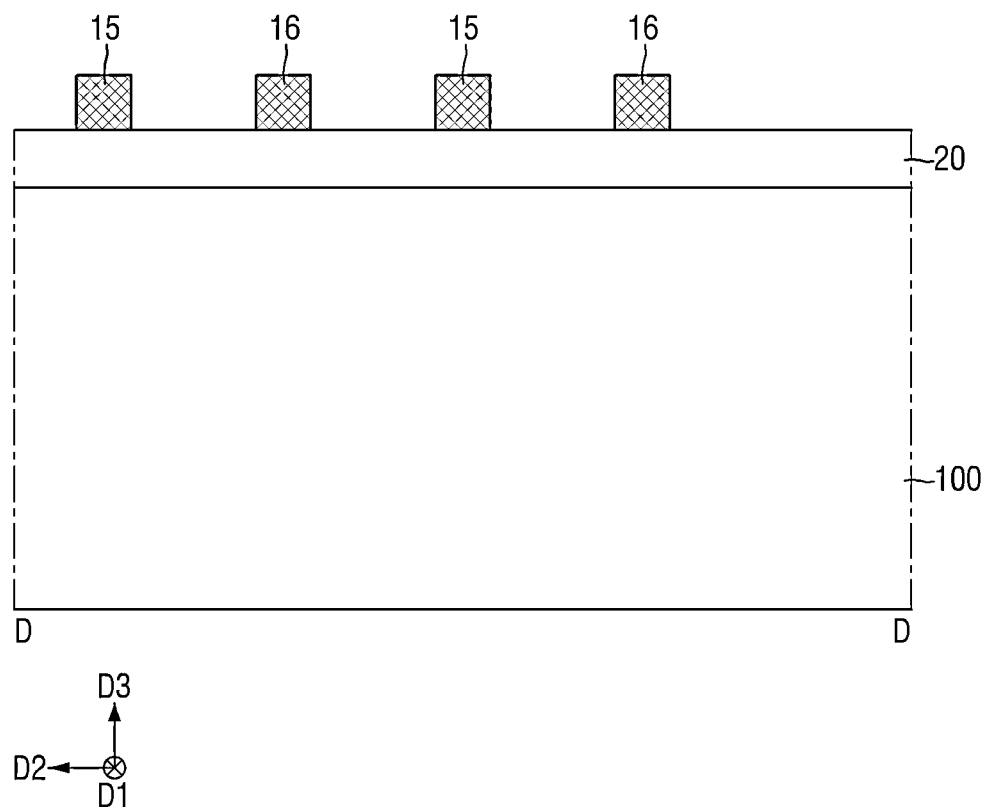

Referring to FIGS. 12A and 12B, the fin mask pattern 10 may be etched using the first mask pattern 11 and the second mask pattern 12. The fin mask pattern 10 may be etched with a wet etching process and/or a dry etching process; however, example embodiments are not limited thereto.

For example, a part of the first fin mask pattern 10_1 and a part of the second fin mask pattern 10_2 may be etched by using the first mask pattern 11 and the second mask pattern 12 as an etch mask.

Through the etching process, the first active pattern mask 15 and the second active pattern mask 16 may be formed on the substrate 100. The first active pattern mask 15 and the second active pattern mask 16 may correspond to the first fin mask pattern 10 that is unetched in the etching process. Subsequently, the first mask pattern 11 and the second mask pattern 12 may be removed.

The first active pattern mask 15 may be positioned in a region in which the first mask pattern 11 is formed. For example, the first active pattern mask 15 may be formed at a position corresponding to the first mask pattern 11.

The second active pattern mask 16 may be positioned in a region in which the second mask pattern 12 is formed. For example, the second active pattern mask 16 may be formed at a position corresponding to the second mask pattern 12. The curved profile of the first mask pattern 11 is transferred to the first mask pattern 11 and the second mask pattern 12. There may be a reduction in a number of mask layers when the first mask pattern 11 includes a circular and/or elliptical perimeter.

Figure 13A:
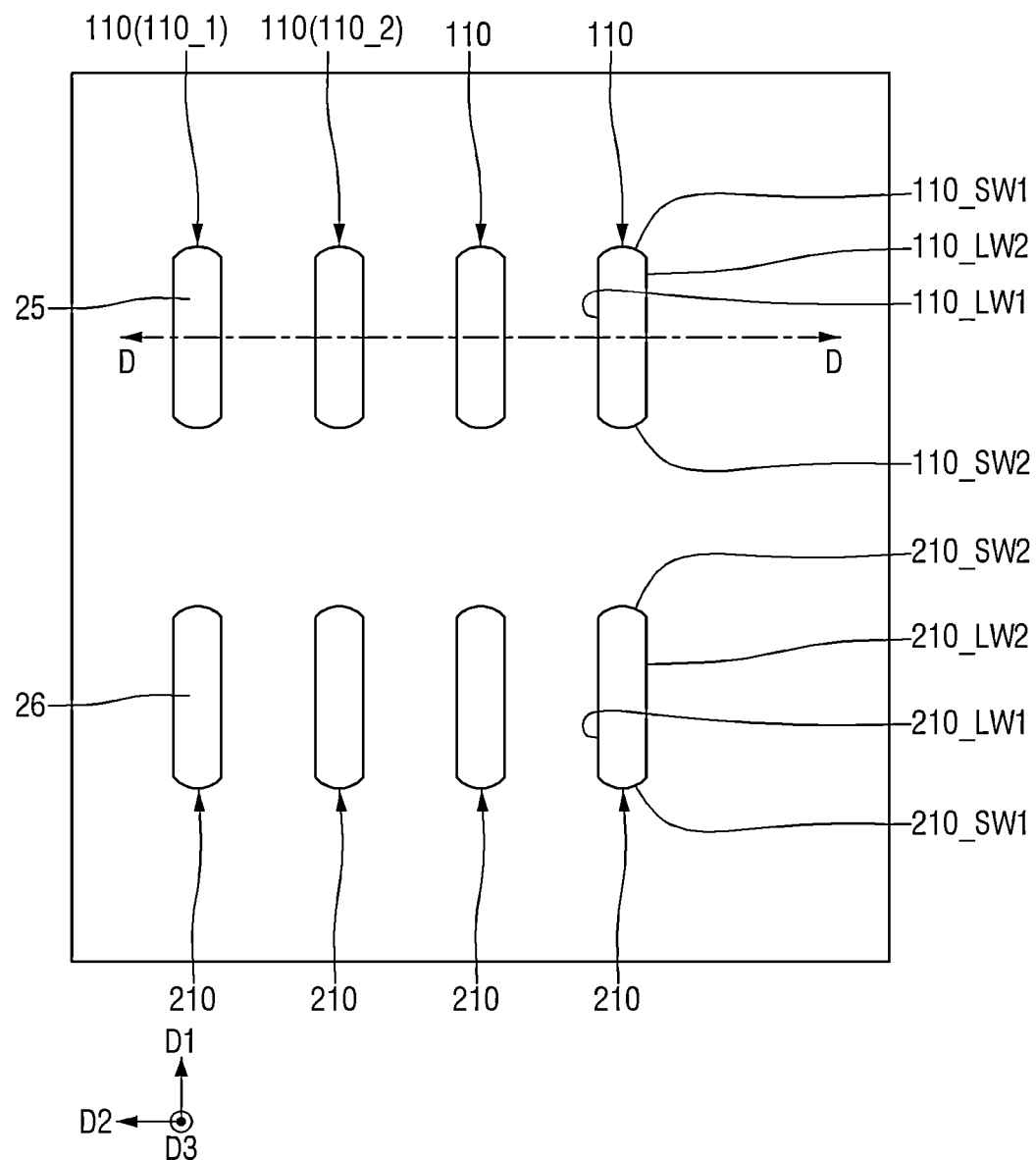

Referring to FIGS. 13A and 13B, the substrate 100 may be etched using the first active pattern mask 15 and the second active pattern mask 16.

By etching the substrate 100, the first active pattern 110 protruding from the substrate and the second active pattern 210 protruding from the substrate 100 may be formed.

The first active pattern 110 may include a first sub-active pattern 110_1 and a second sub-active pattern 110_2. The first sub-active pattern 110_1 may be formed using the first active pattern mask 15. The second sub-active pattern 110_2 may be formed using the second active pattern mask 16.

A first active pattern capping layer 25 formed by etching the pattern capping layer 20 may be formed on the first active pattern 110. A second active pattern capping layer 26 formed by etching the pattern capping layer 20 may be formed on the second active pattern 210.

The first active pattern 110 may include the first long sidewall 110_LW1 and the second long sidewall 110_LW2, and the first short sidewall 110_SW1 and the second short sidewall 110_SW2. The second active pattern 210 may include the first long sidewall 210_LW1 and the second long sidewall 210_LW2, and the first short sidewall 210_SW1 and the second short sidewall 210_SW2.

In some example embodiments, the first active pattern capping layer 25 and the second active pattern capping layer 26 may be formed using the first active pattern mask 15 and the second active pattern mask 16. Subsequently, the first active pattern mask 15 and the second active pattern mask 16 may be removed. After the first active pattern mask 15 and the second active pattern mask 16 are removed, the first active pattern 110 and the second active pattern 210 may be formed by using the first active pattern capping layer 25 and the second active pattern capping layer 26 as masks.

In some example embodiments, the first active pattern capping layer 25 and the second active pattern capping layer 26, and the first active pattern 110 and the second active pattern 210 may be formed by using the first active pattern mask 15 and the second active pattern mask 16. After the first active pattern 110 and the second active pattern 210 are formed, the first active pattern mask 15 and the second active pattern mask 16 may be removed.

Figure 14A:
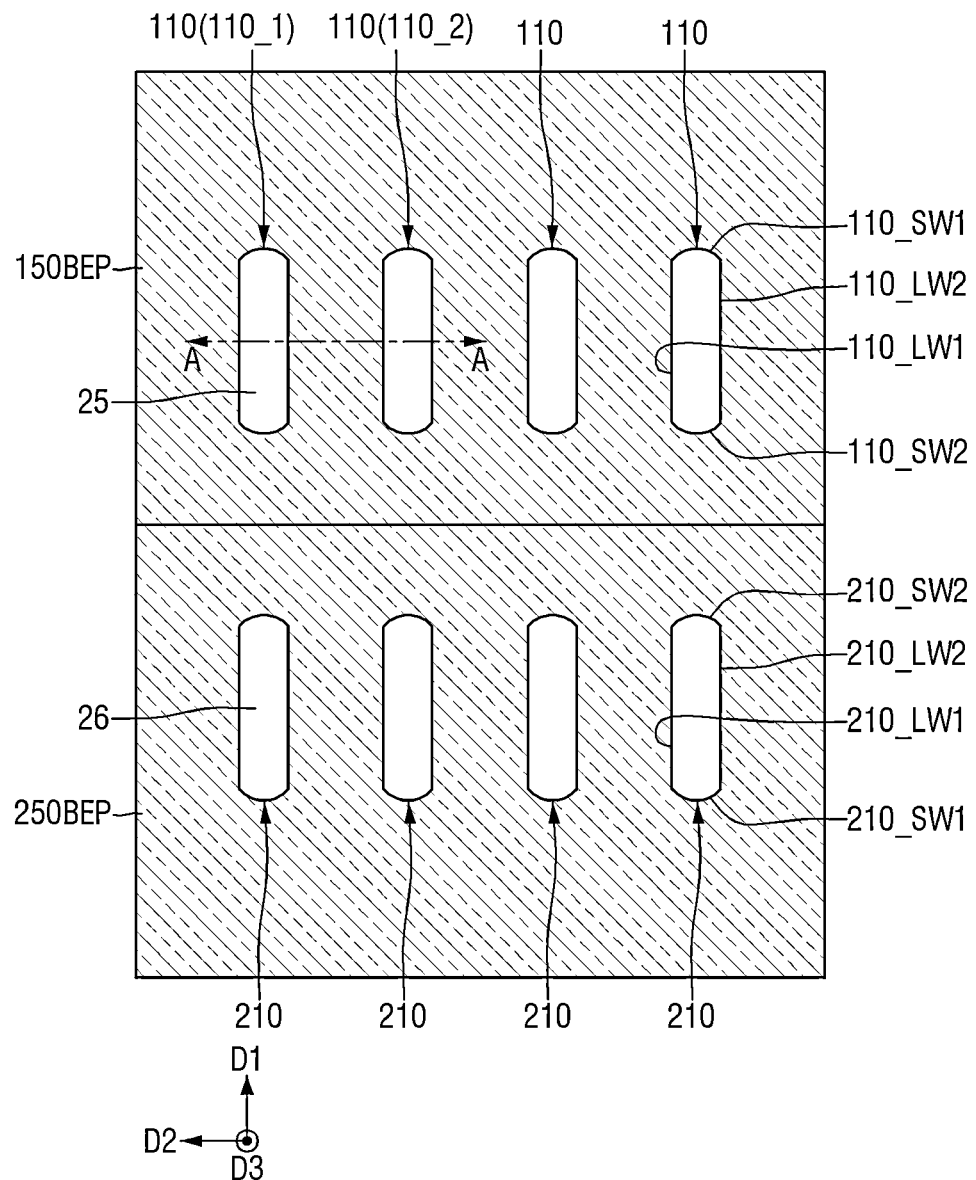

Referring to FIGS. 14A and 14B, the first lower epitaxial recess 150R may be formed at the periphery of the first active pattern 110.

Subsequently, the first lower epitaxial pattern 150BEP filling the first lower epitaxial recess 150R may be formed. In a plan view, the first lower epitaxial pattern 150BEP may surround the periphery of the first active pattern 110. The first lower epitaxial pattern 150BEP is formed between the first sub-active pattern 110_1 and the second sub-active pattern 110_2. For example, the first lower epitaxial pattern 150BEP may be connected to the first sub-active pattern 110_1 and the second sub-active pattern 110_2.

For example, a recess liner including an insulating material may be formed on the first active pattern 110 and the first active pattern capping layer 25. After forming the recess liner, the first lower epitaxial recess 150R may be formed. After the first lower epitaxial pattern 150BEP is formed, the recess liner may be removed.

In addition, the second lower epitaxial pattern 250BEP may be formed at the periphery of the second active pattern 210. The first lower epitaxial pattern 150BEP and/or the second lower epitaxial pattern 250BEP may include germanium, and may have a lattice mismatch with respect to the substrate 100; however, example embodiments are not limited thereto.

Although the first lower epitaxial pattern 150BEP and the second lower epitaxial pattern 250BEP are illustrated as being directly connected, some example embodiments is not limited thereto. Unlike the illustrated example, the first lower epitaxial pattern 150BEP and the second lower epitaxial pattern 250BEP may be spaced apart from each other in the first direction D1.

Figure 15A:
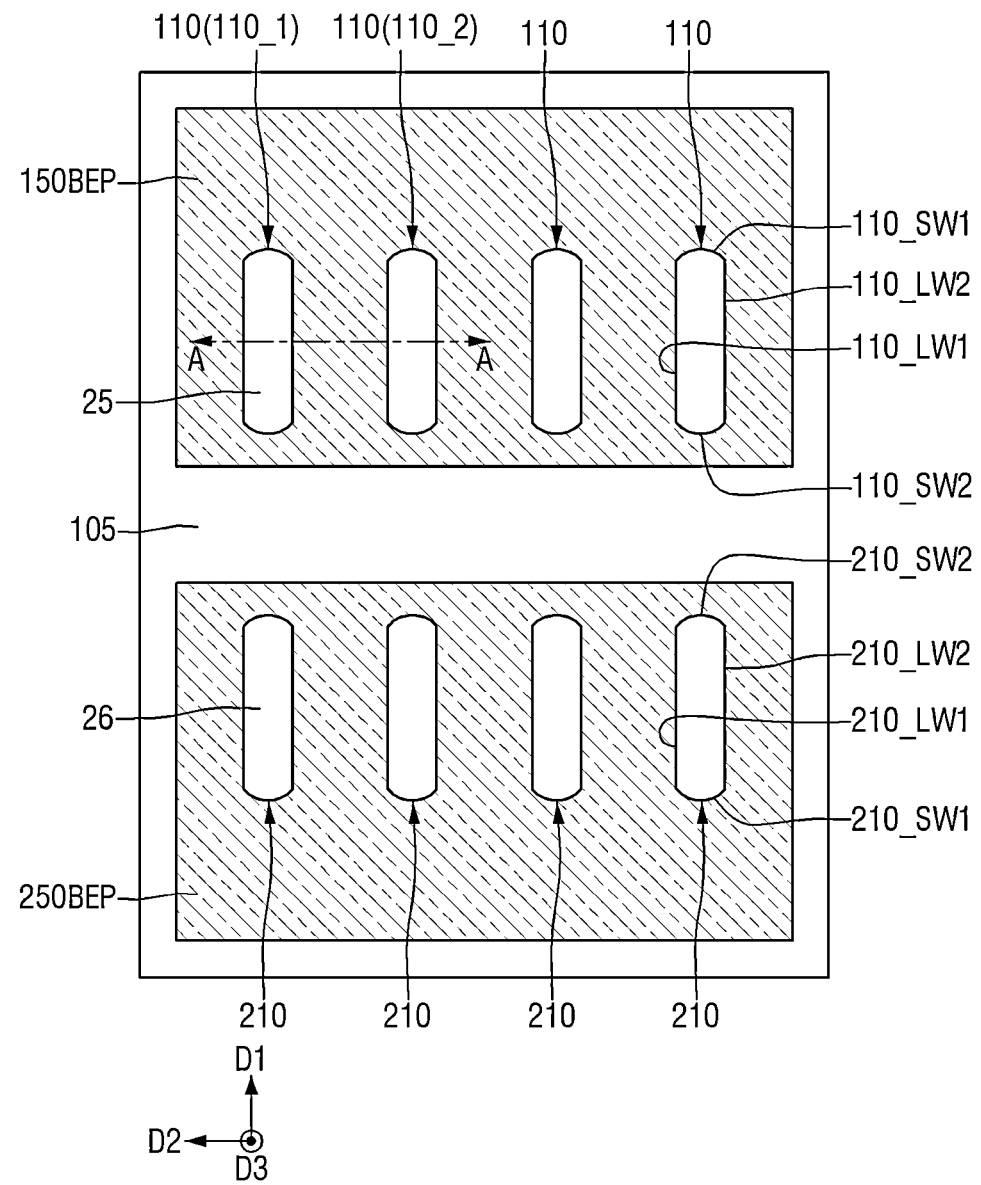

Referring to FIGS. 15A and 15B, the field separation pattern 105 may be formed on the substrate 100.

The field separation pattern 105 separates the first lower epitaxial pattern 150BEP from the second lower epitaxial pattern 250BEP. The first active region RX1 of FIG. 1 and the second active region RX2 may be defined by the field separation pattern 105.

The field separation pattern 105 may cover the upper surface of the first lower epitaxial pattern 150BEP. Although not illustrated, the field separation pattern 105 may cover a upper surface of the second lower epitaxial pattern 250BEP.

For example, the field trench 105T in FIG. 4 may be formed at the periphery of the first active pattern 110 and the second active pattern 210. Subsequently, the field separation pattern 105 filling the field trench 105T may be formed.

Figure 16A:
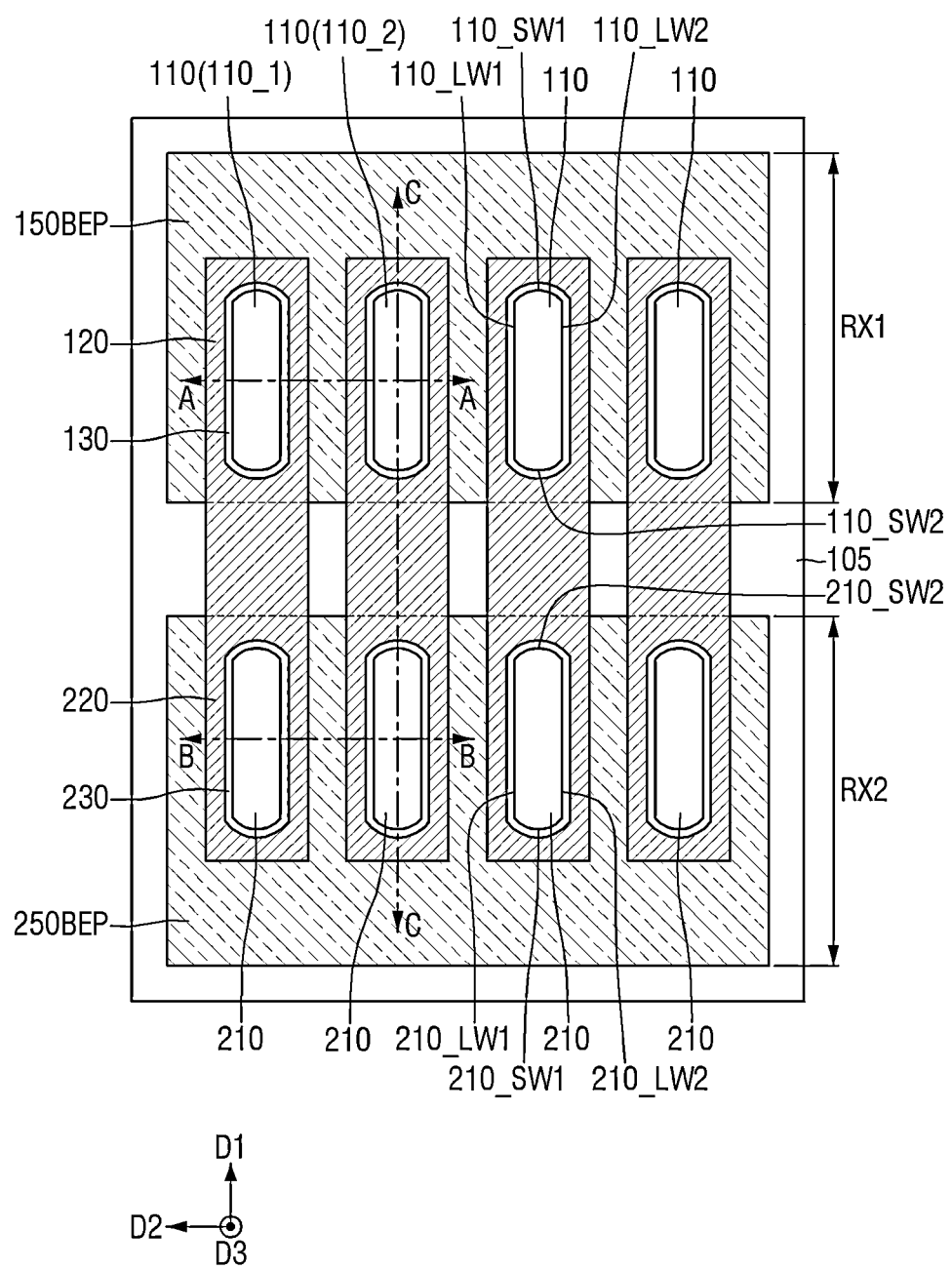
Figure 16B:
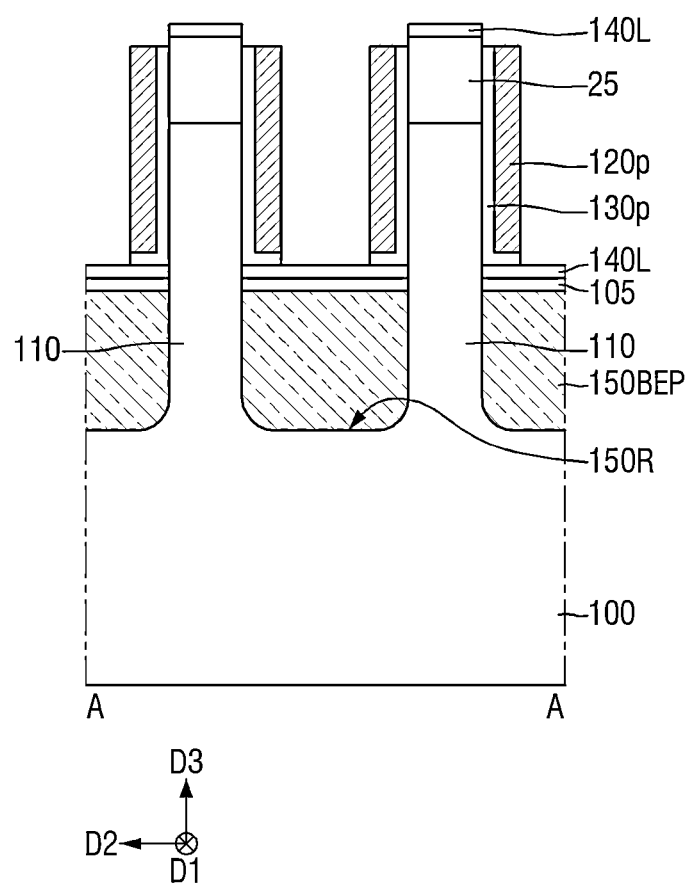

Referring to FIGS. 16A and 16B, the first lower spacer 140L may be formed on the first lower epitaxial pattern 150BEP. The first lower spacer 140L may be formed on the field separation pattern 105. The first lower spacers 140L may also be formed on the first active pattern capping layer 25.

Although not illustrated, the second lower spacer 240L of FIG. 3 may be formed on the second lower epitaxial pattern 250BEP.

Subsequently, a first pre-gate electrode 120p and a second pre-gate electrode 220p may be formed on the field separation pattern 105.

In addition, a first pre-gate insulating layer 130p may be formed between the first pre-gate electrode 120p and the first active pattern 110. A second pre-gate insulating layer 230p may be formed between the second pre-gate electrode 220p and the second active pattern 210.

For example, a pre-gate insulating layer and a pre-gate layer may be sequentially formed along the profiles of the first active pattern 110 and the second active pattern 210, and the first lower spacer 140L.

Subsequently, the pre-gate layer and the pre-gate insulating layer may be patterned to form the first pre-gate electrode 120p, the second pre-gate electrode 220p, the first pre-gate insulating layer 130p, and the second pre-gate insulating layer 230p.

During the patterning of the pre-gate layer and the pre-gate insulating layer, the pre-gate layer and the pre-gate insulating layer on the first active pattern capping layer 25 may be removed.

Although it is illustrated that the first pre-gate electrode 120p and the first pre-gate insulating layer 130p do not extend to the upper surface of the first active pattern capping layer 25, some example embodiments is not limited thereto.

The following description will focus on the portion on which the first active pattern 110 is disposed, that is, a cross section taken along line A-A of FIG. 1.

Figure 17:
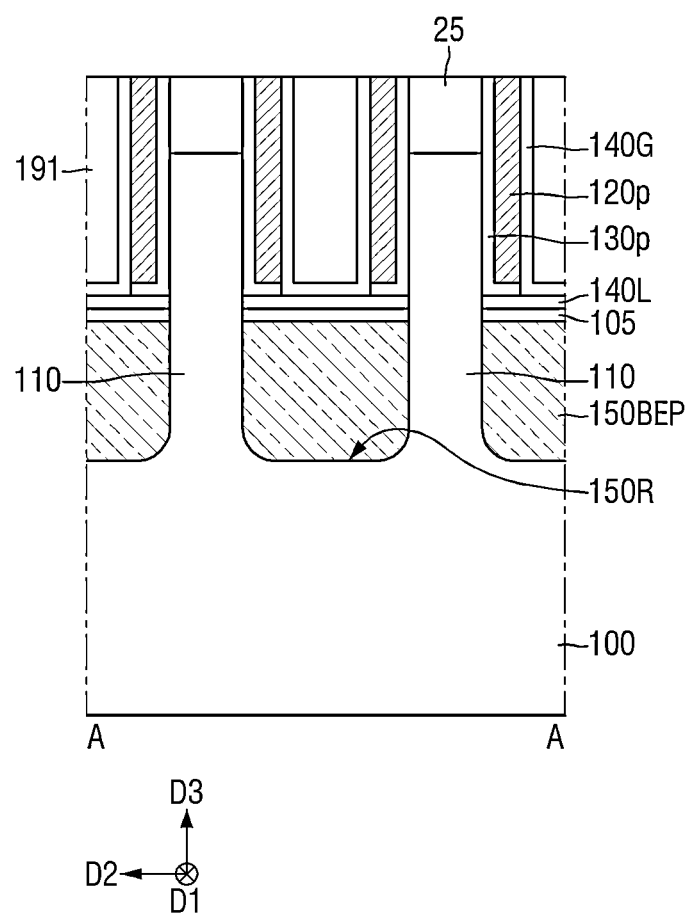

Referring to FIG. 17, the first gate spacer 140G may be formed along a sidewall of the first pre-gate electrode 120p.

Subsequently, the first interlayer insulating layer 191 may be formed on the first gate spacer 140G. The first gate spacer 140G is not formed on the upper surface of the first active pattern capping layer 25.

A upper surface of the first interlayer insulating layer 191 may be coplanar with the upper surface of the first active pattern capping layer 25. While the first interlayer insulating layer 191 and the first gate spacers 140G are formed, the first lower spacer 140L on the upper surface of the first active pattern capping layer 25 may be removed.

Unlike the illustrated example, the first gate spacer 140G may not be formed.

Figure 18:
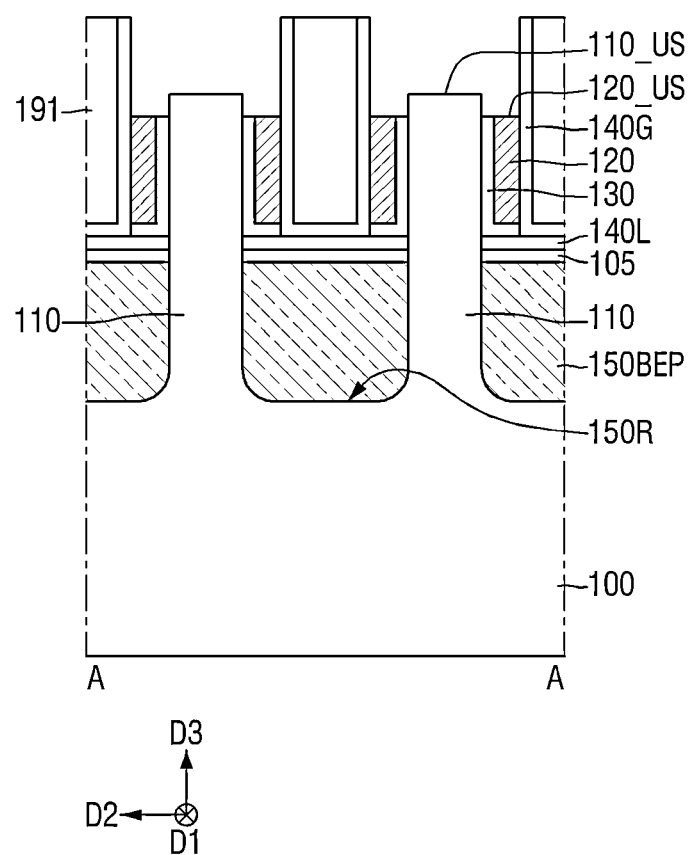

Referring to FIG. 18, the first active pattern capping layer 25 may be removed to expose the upper surface 110_US of the first active pattern.

Subsequently, a part of the first pre-gate electrode 120p and a part of the first pre-gate insulating layer 130p are removed to form the first gate electrode 120 and the first gate insulating layer 130.

The upper surface 120_US of the first gate electrode is lower than the upper surface 110_US of the first active pattern.

Unlike the illustrated examples, a part of the first gate spacer 140G may also be removed, so that the first gate spacer 140G may not extend to the upper surface of the first interlayer insulating layer 191.

Figure 19:
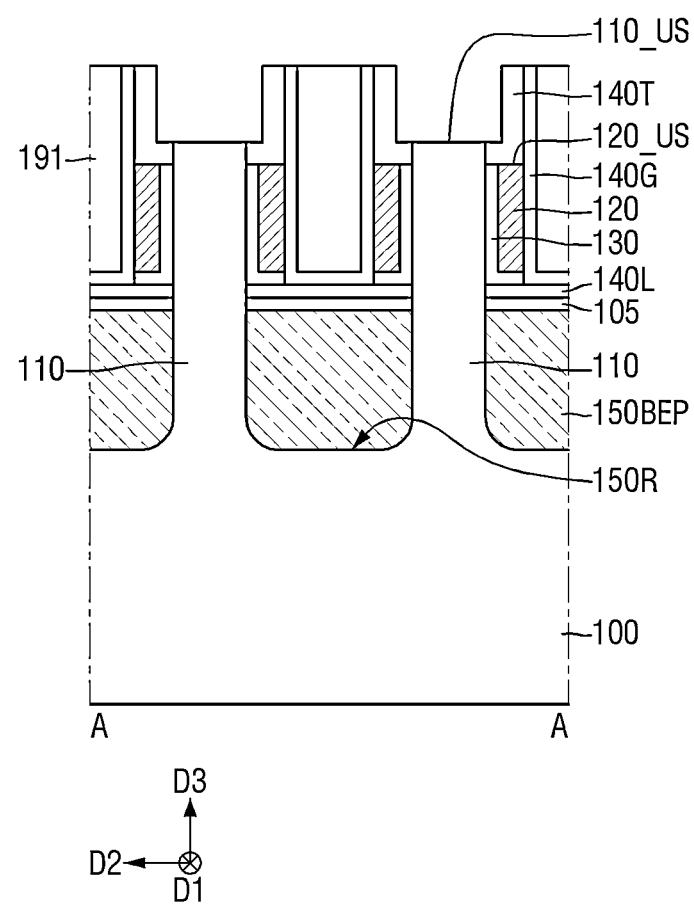

Referring to FIG. 19, the first upper spacer 140T may be formed on the first gate electrode 120 and the first gate insulating layer 130.

The first upper spacer 140T may cover the upper surface 120_US of the first gate electrode. The first upper spacer 140T does not cover the upper surface 110_US of the first active pattern.

The first gate spacer 140G protruding above the upper surface 120_US of the first gate electrode may be a part of the first upper spacer 140T illustrated in FIG. 1.

Figure 20:
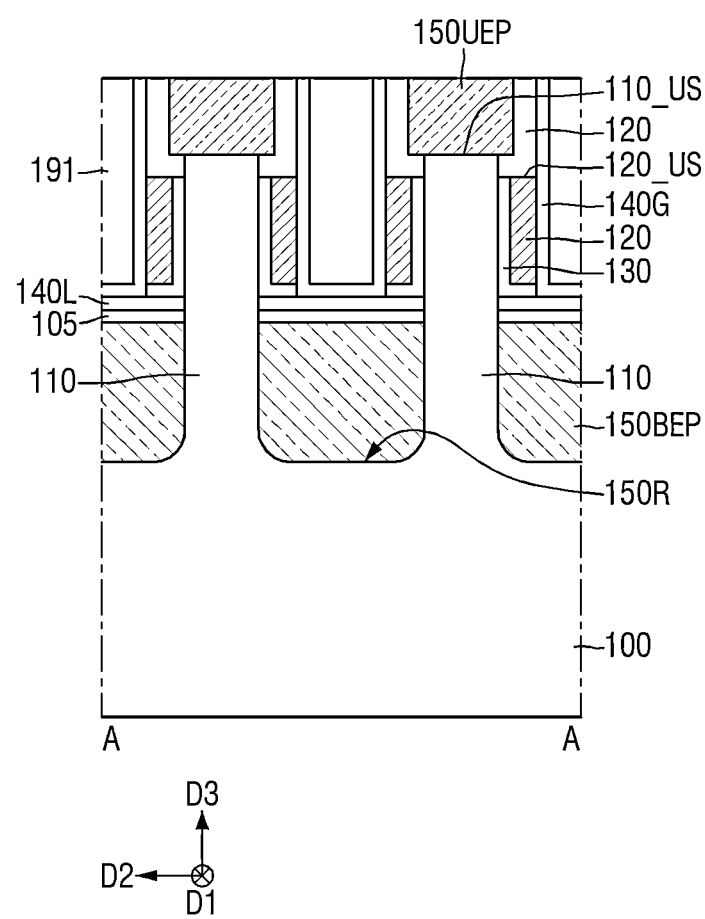

Referring to FIG. 20, the first upper epitaxial pattern 150UEP is formed on the first active pattern 110. The first upper epitaxial pattern 150UEP is connected to the upper surface 110_US of the first active pattern.

For example, the first upper epitaxial pattern 150UEP is formed on the upper surface of the first sub-active pattern 110_1 and the upper surface of the second sub-active pattern 110_2 illustrated in FIG. 13A.

In FIGS. 2 to 4, the contacts 170, 171, 175, 270, and 271, the vias 181 and 182, and the wiring line 185 may be formed.

In concluding the detailed description, those of ordinary skill in the art will appreciate that many variations and modifications may be made to various example embodiments without substantially departing from the principles of the present inventive concept. Furthermore none of the variously disclosed example embodiments are necessarily mutually exclusive with one another. For example, some example embodiments may include features described with reference to one or more figures, and may also include other features described with reference to one or more other figures. Therefore, various example embodiments are used in a generic and descriptive sense only and not for purposes of limitation.

What is claimed is:

1. A semiconductor device comprising:
an active pattern protruding from a substrate, the active pattern including a first long sidewall and a second long sidewall, the first long sidewall and the second long sidewall extending in a first direction and opposite to each other in a second direction;
a lower epitaxial pattern on the substrate and covering a part of the active pattern;
a gate electrode on the lower epitaxial pattern and extending along the first and second long sidewalls of the active pattern; and
an upper epitaxial pattern on the active pattern and connected to an upper surface of the active pattern,
wherein the active pattern includes short sidewalls connecting with the first and second long sidewalls of the active pattern,
at least one of the short sidewalls of the active pattern has a curved surface, and
a length of the first long sidewall is greater than a length of the second long sidewall.

2. The semiconductor device of claim 1, wherein the at least one of the short sidewalls of the active pattern has a convex curved surface protruding in the first direction.

3. The semiconductor device of claim 1, further comprising:
a gate insulating layer between the gate electrode and the active pattern,
wherein the gate insulating layer includes a sidewall portion extending along the first long sidewall of the active pattern, and a bottom portion extending along an upper surface of the lower epitaxial pattern.

4. The semiconductor device of claim 1, wherein an upper surface of the gate electrode is lower than the upper surface of the active pattern.

5. The semiconductor device of claim 1, wherein the gate electrode covers a part of at least one of the short sidewalls of the active pattern.

6. The semiconductor device of claim 1, further comprising:
a gate spacer covering a sidewall and an upper surface of the gate electrode.

7. The semiconductor device of claim 6, wherein the gate spacer extends along a sidewall of the upper epitaxial pattern.

8. The semiconductor device of claim 6, wherein the gate spacer is between the gate electrode and the lower epitaxial pattern.

9. A semiconductor device comprising:
a first active pattern protruding from a substrate and having a first length in a first direction;
a second active pattern protruding from the substrate, spaced apart from the first active pattern in a second direction, and having a second length in the first direction that is different from the first length;
a lower epitaxial pattern between the first active pattern and the second active pattern on the substrate and covering a part of the first active pattern and a part of the second active pattern;
a first gate electrode on the lower epitaxial pattern, the first gate electrode extending along a first long sidewall and a second long sidewalls of the first active pattern;
a second gate electrode on the lower epitaxial pattern and extending along long sidewalls of the second active pattern;
a first upper epitaxial pattern on the first active pattern and connected to an upper surface of the first active pattern; and
a second upper epitaxial pattern on the second active pattern and connected to an upper surface of the second active pattern,
wherein the first and second long sidewalls of the first active pattern and the long sidewalls of the second active pattern extend in the first direction,
the first active pattern includes first short sidewalls connecting with the first and second long sidewalls of the first active pattern,
the second active pattern includes second short sidewalls connecting with the long sidewalls of the second active pattern,
each of the first short sidewalls of the first active pattern and the second short sidewalls of the second active pattern has a curved surface, and
a length of the first long sidewall of the first active pattern s greater than a length of the second long sidewall of the first active pattern.

10. The semiconductor device of claim 9, wherein the first short sidewalls of the first active pattern and the second short sidewalls of the second active pattern have a convex curved surface.

11. The semiconductor device of claim 9, wherein in a plan view, the first gate electrode surround a perimeter of the first active pattern and the second gate electrode surround a perimeter of the second active pattern.

12. The semiconductor device of claim 11, wherein an upper surface of the first gate electrode is lower than the upper surface of the first active pattern, and
an upper surface of the second gate electrode is lower than the upper surface of the second active pattern.

13. The semiconductor device of claim 9, further comprising:
a gate insulating layer between the first gate electrode and the first active pattern,
wherein in a cross-sectional view taken in the second direction, the gate insulating layer has an "L" shape.

14. The semiconductor device of claim 9, further comprising:

a gate spacer covering a sidewall of the first gate electrode and covering an upper surface of the first gate electrode.

15. The semiconductor device of claim 14, wherein the gate spacer extends along a sidewall of the first upper epitaxial pattern.

16. The semiconductor device of claim 9, wherein in a plan view, the lower epitaxial pattern surrounds a perimeter of the first active pattern and a perimeter of the second active pattern.

17. A semiconductor device comprising:
    a first active pattern protruding from a substrate, the first active pattern including a first long sidewall and a second long sidewall extending in a first direction and opposite to each other in a second direction;
    a second active pattern protruding from the substrate, spaced apart from the first active pattern in a first direction, and including long sidewalls opposite to each other in the second direction;
    a first lower epitaxial pattern covering a part of the first active pattern;
    a second lower epitaxial pattern covering a part of the second active pattern;
    a first gate electrode on the first lower epitaxial pattern and extending along the first and second long sidewalls of the first active pattern;
    a second gate electrode on the second lower epitaxial pattern and extending along long sidewalls of the second active pattern;
    a first upper epitaxial pattern on the first active pattern and connected to an upper surface of the first active pattern; and
    a second upper epitaxial pattern on the second active pattern and connected to an upper surface of the second active pattern,
    wherein each of a first short sidewall of the first active pattern and a second short sidewall of the second active pattern facing each other in the first direction has a curved surface, and
    a length of the first long sidewall of the first active pattern is greater than a length of second long sidewall of the first active pattern.

18. The semiconductor device of claim 17, wherein the first gate electrode and the second gate electrode directly connect to each other.

19. The semiconductor device of claim 17, wherein in a plan view, the first lower epitaxial pattern surrounds a perimeter of the first active pattern, and the second lower epitaxial pattern surrounds a perimeter of the second active pattern.

20. The semiconductor device of claim 17, further comprising:
    a field separation pattern separating the first lower epitaxial pattern and the second lower epitaxial pattern.

* * * * *